United States Patent
Fritzemeier et al.

(10) Patent No.: US 6,730,410 B1
(45) Date of Patent: May 4, 2004

(54) SURFACE CONTROL ALLOY SUBSTRATES AND METHODS OF MANUFACTURE THEREFOR

(75) Inventors: Leslie G. Fritzemeier, Mendon, MA (US); Qi Li, Marlborough, MA (US); Martin W. Rupich, Framingham, MA (US); Elliott D. Thompson, Coventry, RI (US); Edward J. Siegal, Malden, MA (US); Cornelis Leo Hans Thieme, Westborough, MA (US); Suresh Annavarapu, Brookline, MA (US); Paul N. Arendt, Los Alamos, NM (US); Stephen R. Foltyn, Los Alamos, NM (US)

(73) Assignees: Electronic Power Research Institute, Incorporated, Palo Alto, CA (US); The Regents of the University of California, Oakland, CA (US)

(*) Notice: Subject to any disclaimer, the term of this patent is extended or adjusted under 35 U.S.C. 154(b) by 80 days.

(21) Appl. No.: 09/616,570

(22) Filed: Jul. 14, 2000

Related U.S. Application Data

(60) Provisional application No. 60/150,465, filed on Aug. 24, 1999, and provisional application No. 60/170,968, filed on Dec. 15, 1999.

(51) Int. Cl.[7] .......................... B23B 15/00; H01B 12/02
(52) U.S. Cl. ..................... 428/469; 428/697; 428/699; 428/701; 428/702; 428/930; 505/236; 505/237; 505/238; 505/239
(58) Field of Search ................................ 428/469, 471, 428/422, 930, 697, 699, 701, 702; 505/236, 237, 238, 239, 514

(56) References Cited

U.S. PATENT DOCUMENTS

| | | | |
|---|---|---|---|
| 3,763,552 A | 10/1973 | Brown et al. | |
| 3,985,281 A | 10/1976 | Diepers et al. | 228/148 |
| 4,859,652 A | 8/1989 | Block | 505/1 |

(List continued on next page.)

FOREIGN PATENT DOCUMENTS

| | | |
|---|---|---|
| EP | 0 308 869 A2 | 3/1989 |
| EP | 0 387 525 A1 | 9/1990 |
| EP | 0 431 782 A1 | 6/1991 |
| EP | 0 506 528 A2 | 9/1992 |
| EP | 0 584 410 A1 | 3/1994 |
| EP | 0 872 579 A1 | 10/1998 |
| WO | WO 92/05591 | 4/1992 |
| WO | WO 97/05669 | 2/1997 |
| WO | WO 98/58415 | 12/1998 |
| WO | WO 99/16941 | 4/1999 |
| WO | WO 99/17307 | 4/1999 |
| WO | WO 99/25908 | 5/1999 |
| WO | WO 99/35083 | 7/1999 |
| WO | WO 01/98076 A1 | 12/2001 |

OTHER PUBLICATIONS

Moore et al., "Sol–Gel Processing of $Y_1Ba_2Cu_3O_{7-x}$ Using Alkoxide Precursors: Two Systems Yielding High Degrees of Thin Film Orientation and Crystal Growth", Materials Letters, vol. 7, No. 12, Mar. 1989, pp. 415–424.

Rupich et al., "Synthesis of superconductors from soluble metal oxo alkoxide precursors", J. Mater. Res., vol. 8, No. 7, Jul. 1993, pp. 1487–1496.

Tanaka et al., "Improvement of $YBa_2Cu_3O_x$ Single–Crystal Surface by Chemical Etching", Jpn. J. App. Phys. vol. 38 (1999) pp L731–L733, Part 2, No. 7A, Jul. 1, 1999.

(List continued on next page.)

*Primary Examiner*—Tom Dunn
*Assistant Examiner*—Colleen P. Cooke
(74) *Attorney, Agent, or Firm*—Fish & Richardson P.C.

(57) ABSTRACT

Methods and articles for controlling the surface of an alloy substrate for deposition of an epitaxial layer. The invention includes the use of an intermediate layer to stabilize the substrate surface against oxidation for subsequent deposition of an epitaxial layer.

18 Claims, 21 Drawing Sheets

U.S. PATENT DOCUMENTS

| | | | |
|---|---|---|---|
| 4,882,312 A | 11/1989 | Mongro-Campero et al. | 505/1 |
| 4,956,340 A | 9/1990 | Kimura et al. | 505/1 |
| 4,959,347 A | 9/1990 | Kobayashi et al. | 505/1 |
| 4,994,433 A | 2/1991 | Chiang | 505/1 |
| 4,994,435 A | 2/1991 | Shiga et al. | 505/1 |
| 5,038,127 A | 8/1991 | Dersch | 335/216 |
| 5,071,828 A | 12/1991 | Greuter et al. | 505/1 |
| 5,073,537 A | 12/1991 | Hung et al. | 505/1 |
| 5,229,358 A | 7/1993 | Kumar | 505/1 |
| 5,231,074 A | 7/1993 | Cima et al. | 505/1 |
| 5,236,890 A | 8/1993 | Murakami et al. | 505/1 |
| 5,304,533 A | 4/1994 | Kobayashi et al. | 505/440 |
| 5,427,055 A | 6/1995 | Ichikawa | 117/92 |
| 5,449,659 A | 9/1995 | Garrison et al. | 505/330 |
| 5,484,766 A | 1/1996 | Shah et al. | 505/441 |
| 5,571,603 A | 11/1996 | Utumi et al. | 428/212 |
| 5,728,214 A | 3/1998 | Konishi et al. | 117/94 |
| 5,741,377 A | 4/1998 | Goyal et al. | 148/512 |
| 5,866,252 A | 2/1999 | de Rochemont et al. | 428/373 |
| 5,958,599 A * | 9/1999 | Goyal et al. | 428/457 |
| 5,964,966 A | 10/1999 | Goyal et al. | 148/426 |
| 5,968,877 A | 10/1999 | Budai et al. | 505/237 |
| 5,981,445 A | 11/1999 | Kirchnerova et al. | 505/440 |
| 6,022,832 A | 2/2000 | Fritzemeier et al. | 505/461 |
| 6,027,564 A | 2/2000 | Fritzemeier et al. | |
| 6,077,344 A | 6/2000 | Shoup et al. | 117/9 |
| 6,172,009 B1 | 1/2001 | Smith et al. | 505/473 |
| 6,256,521 B1 | 7/2001 | Lee et al. | 505/230 |
| 6,451,450 B1 | 9/2002 | Goyal et al. | |

OTHER PUBLICATIONS

Koster et al., "flInfluence of the surface treatment of the homoepitaxial growth of $SrTioO_3$", Materials Science and Engineering B56 (1998) 209–212.

McIntyre et al., "Effect of growth conditions on the properties and morphology of chemically derived epitaxial thin films of $Ba_2Ycu_3O_{7-x}$ on (001) $LaAIO_3$", J. Appl. Phys. 71 (4), Feb. 15, 1992, pp. 1868–1877.

"Fabrication of High Temperature Superconducting Films Using Perfluoro–Organometallic Precursors", IMB Technical Disclosure Bulletin, vol. 32, No. 5B, Oct. 1989, pp. 241.

U.S. patent application Ser. No. 09/617,520, Lu et al., filed Jul. 14, 2000.

U.S. patent application Ser. No. 09/500,717, Fritzemeier et al., filed Feb. 9, 2000.

U.S. patent application Ser. No. 09/500,718, Malozemoff et al., filed Feb. 9, 2000.

U.S. patent application Ser. No. 09/616,566, Zhang et al., filed Jul. 14, 2000.

U.S. patent application Ser. No. 09/615,669, Buczek et al., Jul. 14, 2000.

U.S. patent application Ser. No. 09/617,518, Fritzemeier, Jul. 14, 2000.

U.S. patent application Ser. No. 09/500,701, Buczek et al., filed Feb. 9, 2000.

U.S. patent application Ser. No. 09/579,193, Malozemoff et al., filed May 26, 2000.

Apicella et al., "The Effects of Surface Contamination On The Biaxially Textured Substrate For YBCO Thick Film Deposition", International Journal of Modern Physics B, vol. 13, Nos. 9 & 10 (1999) pp. 997–1004.

He et al., "Deposition of biaxilaly–oriented metal and oxide buffer–layer films on textured Ni tapes: new substrates for high–current, high–temperature superconductors", Physica C, 275 (1997) 155–161.

McIntyre et al, "Epitaxial nucleation and growth of chemically derived $Ba_2Ycu_3O_{7-x}$ thin films on (001) $SrTiO_3$", Journal of Applied Physics, 77(1995) May 15, No. 10, pp. 5263–5272.

He et al., "Growth of biaxally oriented conductive $LaNiO_3$ buffer layers on textured Ni tapes for high–Tc–coated conductors", Physica C 314 (1999) 105–111.

Sheth et al., "Bench Scale Evaluation of Batch Mode Dip–Coating of Sol–Gel $LaAIO_3$ Buffer Material", IEEE Transactions on Applied Superconductivity, vol. 9, No. 2, Jun. 1999, pp. 1514–1518.

Smith et al., "High Critical Current Density Thick MOD–Derived YBCO Films", IEEE Transactions on Applied Superconductivity, vol. 9, No. 2, Jun. 1999, pp. 1531–1534.

Beach et al., "Sol–Gel Synthesis of Rare Earth Aluminate Films as Buffer Layers for High Tc Superconducting Films", Mat. Res. Soc. Symp. Proc. vol. 495, 195, pp. 263–270.

Lee et al., "Alternative Buffer Architectures for High Critical Current Density YBCO Superconducting Deposits on Rolling Assisted Biaxially–Textured Substrates", Jpn. J. Appl. Phys. vol. 38 (1999) Pt. 2, No. 2B, pp. 178–180.

Paranthaman et al., Growth of biaxially textured $RE_2O_3$ buffer layers on rolled–Ni substrates using reactive evaporation for HTS–coated conductors, Supercond. Sci. Techno. 12(1999) 319–315. Printed in the UK.

Rupich et al., "Growth and Characterization of Oxide Buffer Layers for YBCO Coated Conductors", IEEE Transactions on Applied Superconductivity, vol. 9, No. 2, Jun. 1999, pp. 1527–1530.

Shoup et al., "Epitaxial Thin Film Growth of Lanthanum and Neodymium Aluminate Films on Roll–Textured Nickel Using a Sol–Gel Method", Journal of the American Ceramic Society, vol. 81, No. 11, Nov. 1998, pp–3019–3021.

"Dry Etching for VLSI Fabrication", vol. 1, eds. S. Wolf and R.N. Tamber, Lattice Press, Sunset Park, CA, pp. 539–574 (1986).

Boffa et al., "Laser–ablation deposition of $CeO_2$ thin films on biaxally textured nickel substrates", *PHISICA C*, 312 (1999) 202–212.

\* cited by examiner

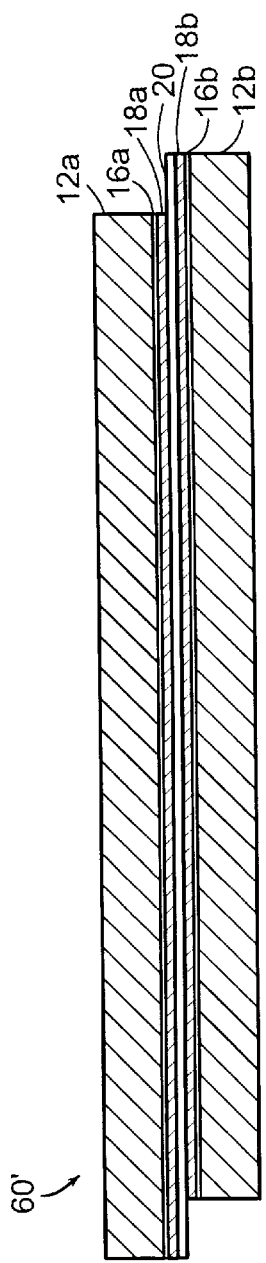
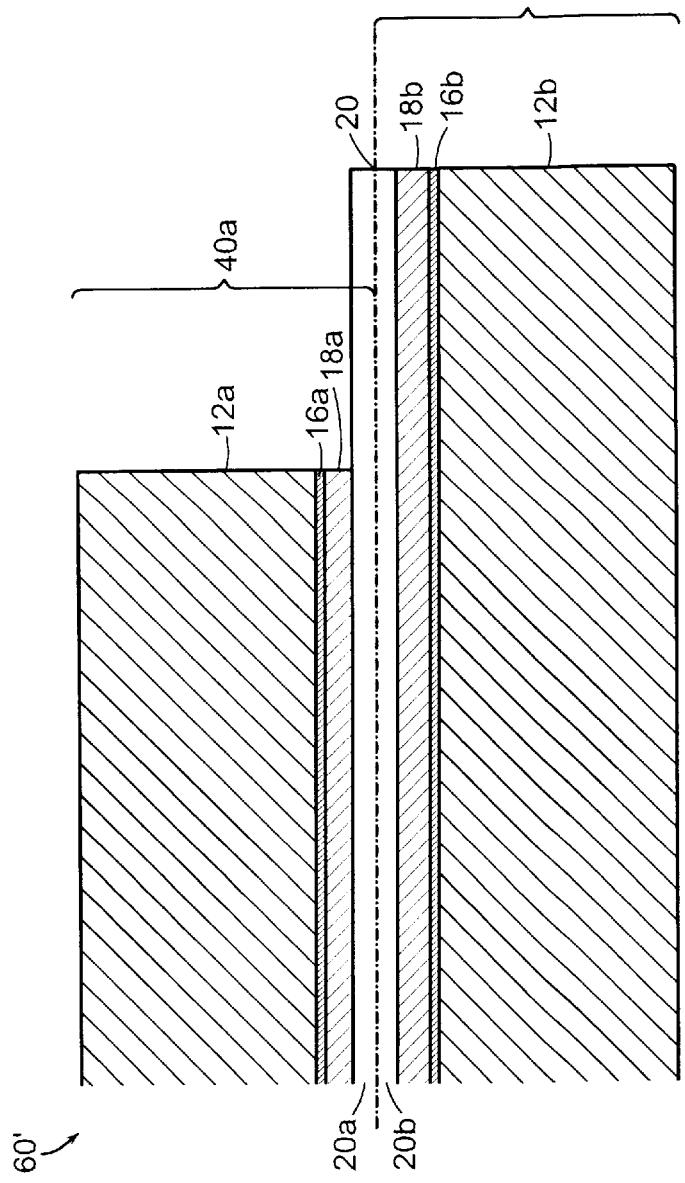

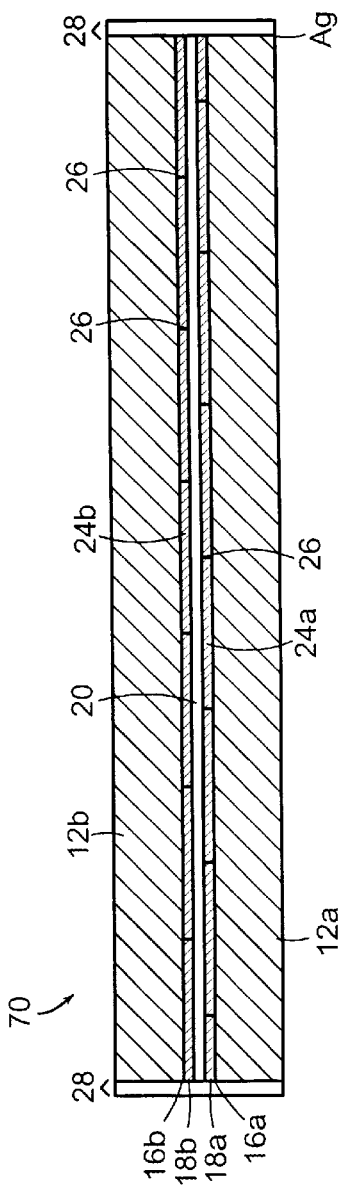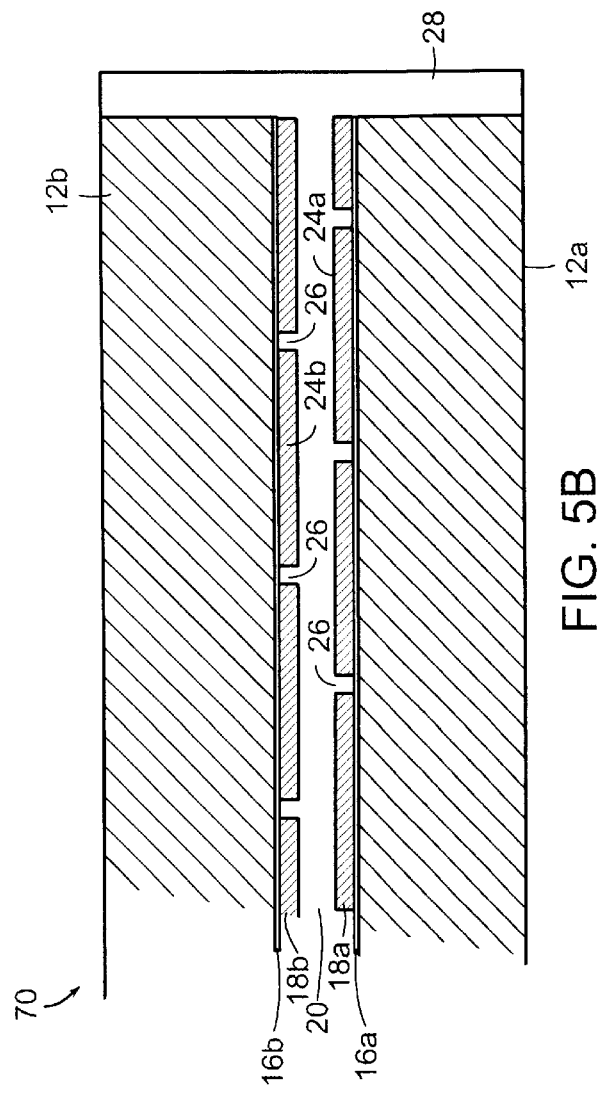

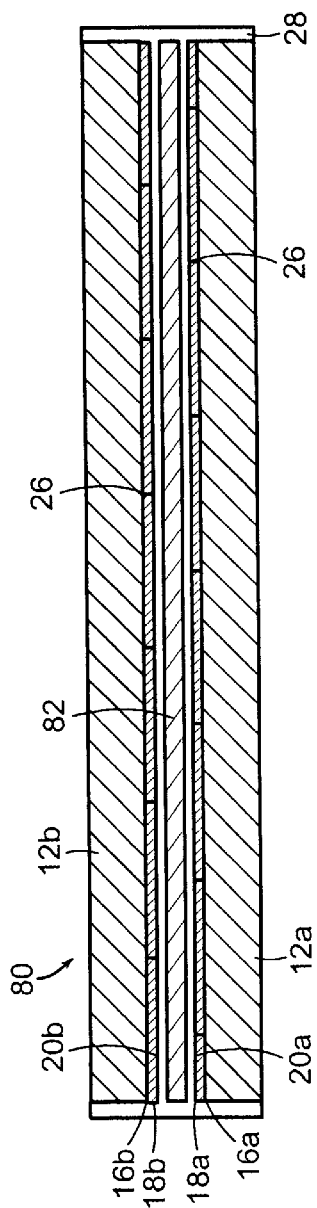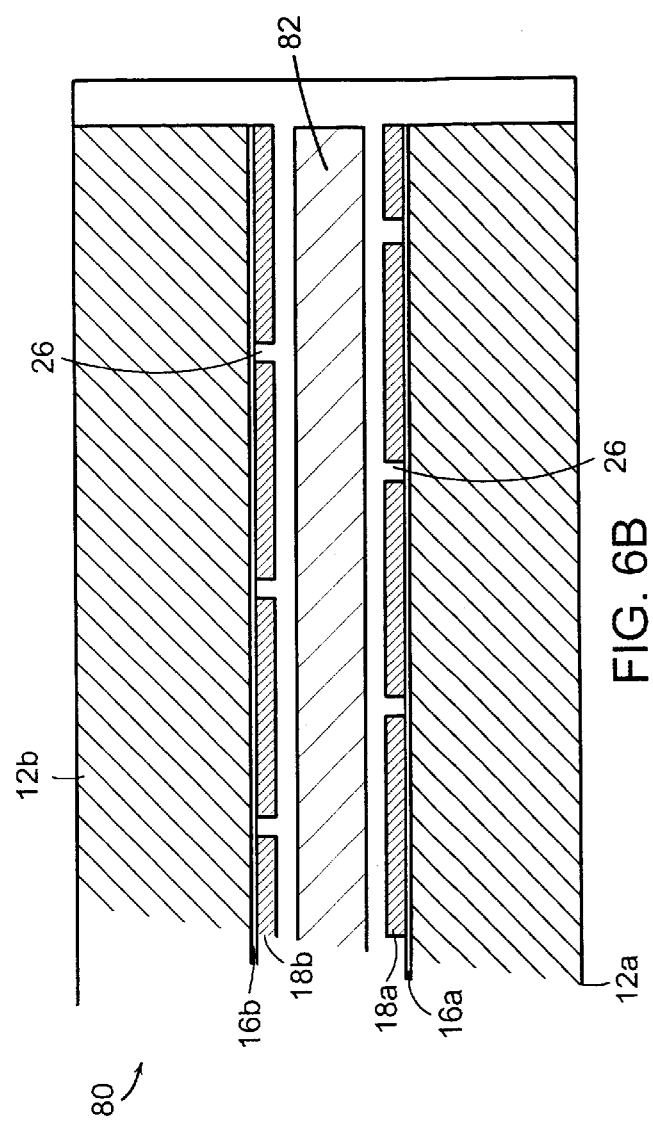
FIG. 6A
FIG. 6B

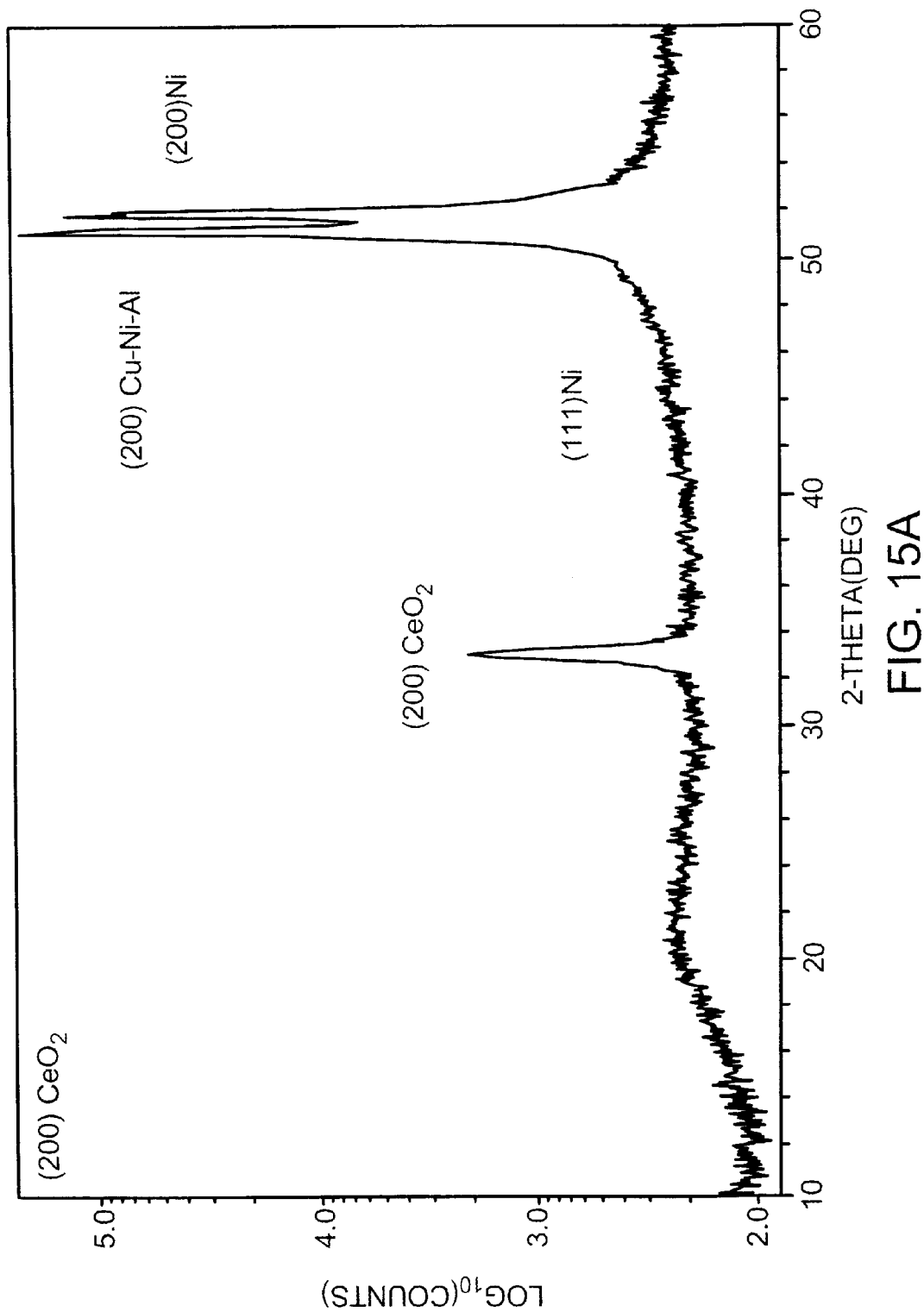

SURFACE CONTROL ALLOY SUBSTRATES AND METHODS OF MANUFACTURE THEREFOR

This application claims priority under 35 U.S.C. §119(e)(1) to U.S. Provisional Patent Application No. 60/150,465, filed on Aug. 24, 1999, entitled "Surface Control Alloy Substrates" and U.S. Provisional Patent Application No. 60/170,968, filed on Dec. 15, 1999, entitled "Surface Control Alloy Substrates and Methods of Manufacture Therefor," both of which are incorporated by reference.

This invention was made under Cooperative Agreement No. LA93STC10115 between American Superconductor Corporation and the Regents of the University of California which are in turn acting under Contract W-7405-ENG-36 with the Department of Energy. The Government has certain rights in this Invention.

TECHNICAL FIELD

The present invention generally relates to a method for controlling the surface character of bi-axially textured alloy substrates. The invention more particularly relates to the use of intermediate epitaxial films on textured metal substrates. More specifically, the present invention relates to the use of an epitaxial film deposited on a biaxially textured alloy substrate, the epitaxial film serving to stabilize the substrate surface against oxidation for subsequent deposition of an epitaxial film.

BACKGROUND OF THE INVENTION

Some high temperature superconductors require well-aligned crystallites with low angle grain boundaries in order to yield high critical currents at relatively high temperatures. For example, thin films consisting of polycrystalline yttrium-barium-copper-oxide superconductors (YBCO) can yield a critical current density exceeding $10^6$ A/cm$^2$ at 77K, self field, when a substantial portion of the local grain boundary misorientations in the film are well below 10°, thereby mitigating the well known weak link behavior in current transport across boundaries between misoriented regions. This requirement for achieving high critical current densities in polycrystalline films can also be expressed as the YBCO film having a bi-axial texture in which, for example, the c-axis of each crystallite is substantially perpendicular to the film surface and the collective a-axes of all crystallites align in substantially the same direction in the plane of the film surface. To obtain an YBCO thin film with a good (for example, <<10° for a single crystal substrate) bi-axial texture, it can be deposited in an epitaxial manner on an oxide single crystal such as LaAlO$_3$. This is not a commercially viable process for many applications since single crystal substrates cannot be economically produced in very long lengths or large areas. It is therefore more appropriate for industrial purposes to consider the epitaxial deposition of YBCO on a bi-axially textured buffer layer (often an oxide layer), which in turn has been deposited on a flexible metal substrate tape.

The flexible metal substrate can be used to provide a necessary template for texture and mechanical stability during handling and use in applications. Face centered cubic (fcc) metals and some alloys based on fcc metals are especially useful for substrate material, as they can be bi-axially textured using well known rolling deformation and annealing processes. A well-known texture in these metals and alloys is the so called "cube texture", in which the c-axis of the substrate crystallites is substantially perpendicular to the substrate surface, and the a-axes align primarily along the tape direction. The cube texture can often be made with very low full-width at half-maximum (FWHM) values obtained from X-ray pole figures, an indication of collective alignment of both c- and a-axes of all crystallites. Under controlled rolling and annealing processes, these deformation textured metal tapes possess texture approaching that of single crystals. In practical application of the process, the FWHM texture is less than 10 degrees and more typically less than 8 degrees.

Nickel (Ni) is one fcc metal that can be made into thin substrates with a well-defined cube texture using the rolling and annealing process. Prior work has shown that oxide buffer layers can be deposited on a biaxially textured nickel surface using conditions under which nickel oxide is not stable, but the buffer layer (for example, CeO$_2$ or Y$_2$O$_3$) is stable, allowing the oxide to inherit the texture of the underlying nickel substrate (that is epitaxy). A limitation to use of Ni, however, is its ferromagnetic character that may preclude its use in superconducting tape for alternating current (AC) applications such as power transmission cables, motors, and transformers. In addition, Ni is mechanically weak following the typical annealing heat treatment used to form the cube texture.

For these reasons, Ni alloys and other alloys have been developed to make strong, non-magnetic bi-axially textured substrates. These alloys often have alloying elements such as chromium (Cr) or aluminum (Al) that have a tendency to form stable oxides under very low oxygen partial pressure ($P_{O2}$). The growth of epitaxial layers on metal or alloy substrates is commonly carried out under $P_{O2}$ of less than $10^{-17}$ Torr and 650° C., where the constituent elements such as Cr or Al will form surface oxides. The presence of these surface oxides can inhibit the growth of the epitaxial layers. This can be explained in part due to the fact that the surface oxides are typically randomly oriented on the textured alloy surface and can therefore interfere with a high quality epitaxial buffer layer deposition.

Texturing in HTS films has been demonstrated by epitaxial growth of the superconductor on appropriate templates. As used herein, "epitaxial" means that the crystallographic orientation of the superconducting film is derived from and directly related to the crystallographic orientation of the underlying template. Early work used single crystal oxide substrates as the HTS growth template. For many practical applications, the substrate must be flexible. A well-oriented template can be achieved by means of ion beam assisted deposition (IBAD) of oxide buffer layers on random polycrystalline metal substrates. High quality epitaxial superconducting films have been grown on such tapes. In alternative and preferred embodiments, texturing in substrates can be induced using the deformation texturing ("DeTex") process (as set forth herein) and epitaxial deposition of buffer layer(s) and subsequent functional layer(s) can be accomplished as also described herein.

One major issue therefore relating to the epitaxial deposition of oxide buffer layers on a bi-axially textured substrate, whether a metal or an alloy, is the control of the oxygen partial pressure, or $P_{O2}$. This is true for any buffer deposition technique, whether it is Physical Vapor Deposition (PVD) by pulsed lasers, sputtering, electron beam, or thermal evaporation, or by a non-vacuum process such as Metal-Organic-Deposition (MOD). The objective is to avoid formation of native oxide films on the surface of the substrate, thereby allowing the deposited buffer layer to nucleate and grow with the appropriate biaxial texture from the substrate surface. Some metals such as silver (Ag) have a natural ability to allow for growth using a great variety in $P_{O2}$ conditions, but suffer from other disadvantages such as being difficult to texture, having a large coefficient of thermal expansion (CTE), high price, low mechanical strength and the like. Others such as copper (Cu) will easily oxidize. In some metals (for example, Ni), the $P_{O2}$ can be carefully controlled at the deposition temperature to provide sufficient oxygen to stabilize the buffer layer but insufficient to oxidize the Ni due to basic thermodynamic considerations. Methods to control $P_{O2}$ below the thermodynamic stability limit for NiO formation have been developed. For this reason, Ni has been established as a good deposition surface for epitaxial oxide layers such as oxides of the rare earth metals (yttria, ytterbia, ceria and the like). As discussed above, however, a pure Ni substrate suffers from other deficiencies that preclude its use in various applications.

In the context of surface control of substrates, it would therefore be desirable to provide controlled methods and articles for producing a surface on nonmagnetic, high strength biaxially textured substrates upon which an epitaxial layer can be deposited, thereby overcoming the shortcomings associated with the prior art.

SUMMARY OF THE INVENTION

A method has been established to mitigate stable oxide formation until a first epitaxial (for example, buffer) layer has been produced on the biaxially textured alloy surface.

It is therefore an object of this invention to provide an improved process for producing biaxially textured epitaxial (for example, buffer) layers on biaxially textured metal or alloy substrates.

It is another object of the present invention to provide an economical and commercially viable process for the deposition of epitaxial thin films on nonmagnetic and biaxially textured alloy substrates suitable for use in scale-up and manufacturing processes.

It is another object of the present invention to provide a process for depositing high performance high temperature superconducting films on various substrates and epitaxial layers suitable for use in scale-up and manufacturing conditions.

The present invention accomplishes these and other objectives by providing a method for forming epitaxial (for example, buffer) layer films on the surface of a biaxially textured, nonmagnetic substrate having an element or elements which are oxide-scale forming. The invention also includes methods for forming composite articles having multiple layers, one or more of which may be incorporated into an alloy substrate and having substantial alignment both in-plane and out-of-plane.

In one aspect, the invention includes a method of forming a composite article by forming a first film (for example, Ni) which is epitaxially deposited onto a biaxially textured alloy substrate and which prevents the formation of surface oxides on the biaxially textured alloy substrate during the initial deposition of a second film and wherein the first film provides a template for the growth of the second film. The first film is typically a metal such as Ni which is low cost and upon which epitaxial layers can be deposited in a controlled environment under which nickel oxide is not thermodynamically stable. In some embodiments, the Ni film would subsequently be incorporated into the substrate alloy by interdiffusion of Ni into the alloy and the elements of the alloy into the Ni where its ferromagnetic character would be eliminated or effectively eliminated to allow for use in various applications and the protective oxide scale could then form from the elements present in the substrate alloy beneath the epitaxial deposited buffer layer. The purpose of the interdiffusion is to substantially eliminate the negative aspects of Ni as a metal layer (for example, ferromagnetism, oxidation) during subsequent processes and use, and not for the purposes of forming a substrate alloy.

In another aspect, the invention features an article having a biaxially textured alloy substrate, a first metal film which is epitaxial on the substrate surface and which inhibits the formation of oxide surface scales during a controlled high temperature environmental exposure, such exposure being typical of initial buffer layer deposition.

In yet another aspect, the invention features an article having a biaxially textured alloy substrate, a buffer layer having a first biaxially textured thin film that was formed on a transient metal layer and which has since been incorporated into the alloy substrate, and a second film which has been epitaxially deposited on the first biaxially textured thin film. The second film, and possibly subsequent films can be another buffer layer material. In addition or alternatively, the second film may include materials selected from superconductors, semiconductors, photovoltaic materials, magnetic materials, capacitors and precursors of superconductors.

In one embodiment, the alloy substrate is a Cu-Ni-Al alloy that is biaxially textured by rolling deformation and annealing. The native aluminum-oxide scale which forms during the texture anneal can be removed by, for example, etching or sputtering. The substrate alloy alignment is preferably less than about 10 degrees FWHM in a {111} phi-scan. An epitaxial nickel layer is deposited on the surface of the substrate alloy to a thickness of about 0.2 microns. A first buffer layer is deposited upon the epitaxial nickel layer using for example electron beam evaporation. The buffer layer material is preferably $CeO_2$ or $Y_2O_3$. The buffer layer is deposited typically at 650° C. in a background environment of Ar/5% hydrogen at less than 200 mTorr. The buffer layer is typically less than about 20 nm in thickness. This first epitaxial buffer layer film will provide a template for the growth of subsequent epitaxial layers as necessary to produce a commercial product. During the growth of this and subsequent epitaxial layers at elevated temperatures (for example, 650–725° C.), the Ni layer will be gradually incorporated into the substrate alloy leaving the epitaxial buffer layer adherent to a substantially homogenous substrate.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

BRIEF DESCRIPTION OF THE DRAWINGS

For a fuller understanding of the present invention, reference is made to the following description taken in conjunction with the accompanying drawings, in which:

FIG. 4A illustrates an alternative embodiment of HTS coated conductor composite in accordance with the present invention;

FIG. 4B illustrates an expanded view of FIG. 4A;

FIG. 5A shows yet another alternative embodiment of an HTS coated conductor composite in accordance with the present invention;

FIG. 5B illustrates an expanded view of FIG. 5A;

FIG. 6A shows yet another alternative embodiment of an HTS coated conductor composite in accordance with the present invention;

FIG. 6B illustrates an expanded view of FIG. 6A;

FIG. 15A is θ–2θ x-ray diffraction scan of a Ni-coated CuNiAl substrate;

Similar reference characters refer to similar parts throughout the several views of the drawings.

DETAILED DESCRIPTION

Figure 2A:
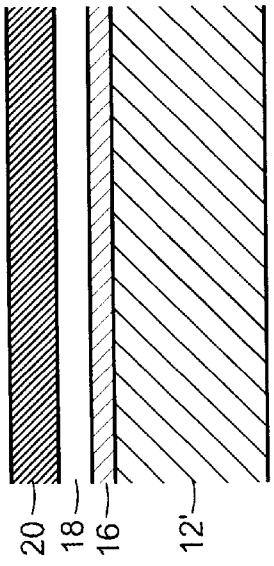
FIG. 2A shows an article formed in accordance with the present invention.
Figure 2B:
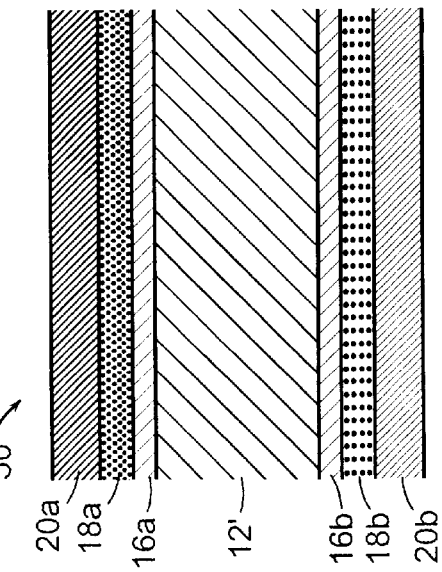
FIG. 2B depicts an alternative embodiment of an article formed in accordance with the present invention.

The invention will be primarily described in connection with the formation of epitaxial oxide buffer layers deposited onto a biaxially textured nickel (Ni) surface that has been formed on a Cu—Ni based alloy. This embodiment is intended to be for purposes of illustration and does not limit the scope of the invention, which is determined by the claims and their equivalents. It will be apparent that other epitaxial layers and other intermediate or transient layer materials can be deposited on other substrate alloys.

Intermediate layers suitable for use in the present invention include those epitaxial metal or alloy layers that do not form surface oxides when exposed to conditions as established by $P_{O2}$ and temperature required for the initial growth of epitaxial films (for example, $P_{O2}$ and temperature conditions required for the growth of epitaxial buffer layers). In addition, the intermediate layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial (for example, buffer) layers due to, for example, lack of texture in this oxide layer.

In some embodiments the intermediate layer is transient in nature. "Transient", as used herein, refers to an intermediate layer that is wholly or partly incorporated into or with the biaxially textured substrate alloy following the initial nucleation and growth of the subsequently deposited epitaxial film. Even under these circumstance, the intermediate layer and biaxially textured substrate remain distinct until the epitaxial nature of the deposited film has been established. The use of transient intermediate layers may be preferred when the intermediate layer possesses some undesirable property (for example, the intermediate layer is magnetic, such as Ni).

Exemplary intermediate metal layers include nickel, gold, silver, palladium and alloys thereof. Impurities or alloys may include alloys of nickel and/or copper. Epitaxial films or layers deposited on an intermediate layer can include metal oxides, chalcogenides, halides and nitrides. These epitaxial layers could be a buffer layer, or layers, which serve as a template for the deposition of functional layers (for example, superconductor, semiconductor, photovoltaic). Alternatively, the epitaxial layer could be a functional layer itself.

As used herein, "biaxial" means that the crystal grains in the substrate or film are in close alignment with both a direction perpendicular to the surface of the film and a direction in the plane of the film. Biaxial texturing allows for the production of high current densities in the superconducting film. This biaxial texturing minimizes the weak link effects of high angle grain boundaries allowing the achievement of very high critical current densities in these films at typical device operating conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial (for example, buffer) layer growth conditions and lattice matching with the epitaxial (for example, buffer) layer, the thickness of the deposited metal (or alloy) layer has to be adapted to the epitaxial (for example, buffer) layer deposition conditions, in particular to temperature. For example, if a CuNiX alloy is used as a substrate alloy (X is an oxide former such as Cr, Al, Mg or the like), Ni as an intermediary metal layer, and 600° C. as an epitaxial buffer layer deposition temperature, the deposited Ni layer needs to be thicker than 0.2 micrometer, preferably 0.5 to 1 micrometer. This is to ensure that the entire intermediate layer is not absorbed by or incorporated with the substrate alloy before the initial epitaxial buffer layer covers the entire surface of the intermediate layer and to ensure that the substrate alloy oxide scale forming element(s) does not reach the deposition surface before the initial epitaxial buffer layer covers the entire surface of the intermediate layer. If CuNi is used as a substrate alloy, the Ni needs to be thicker than one micrometer, preferably 2–5 micrometer, as the Ni will also act as an oxygen barrier to avoid oxidation of the CuNi alloy. More generally, conventional diffusivity calculations can be used to determine the time necessary for diffusion of substrate alloy elements to the surface of the intermediate layer, and/or for the intermediate layer to be incorporated into the substrate alloy under the specific temperatures used for epitaxial layer deposition.

Deposition of the intermediate metal layer can be done in a vacuum process such as evaporation or sputtering, or by electrochemical means such as electroplating (with or without electrodes). These deposited intermediate metal layers may or may not be epitaxial after deposition (depending on the substrate temperature during deposition), but epitaxial orientation can subsequently be obtained during a post-deposition heat treatment. For example 600C heat treatment for 1–2 hours has been found to be sufficient to induce texture in evaporated, sputtered and electroplated Ni layers on the cube textured Cu-46% Ni substrates.

Figure 1A:
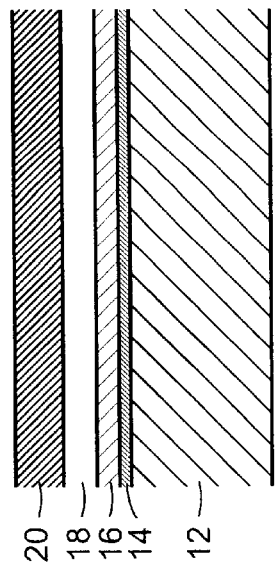
FIG. 1A illustrates an intermediate article formed in accordance with the present invention.
Figure 1B:
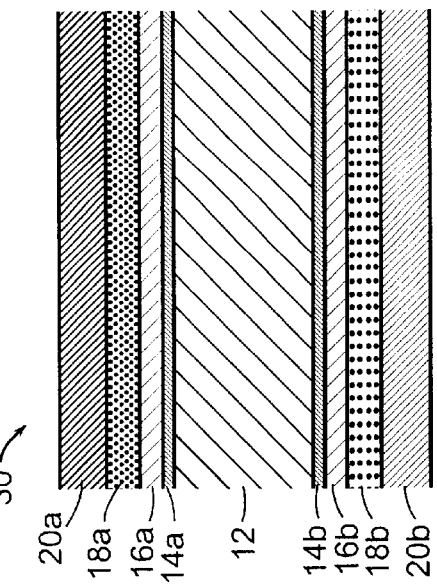
FIG. 1B illustrates an alternative embodiment of an intermediate article formed in accordance with the present invention.
Figure 3B:
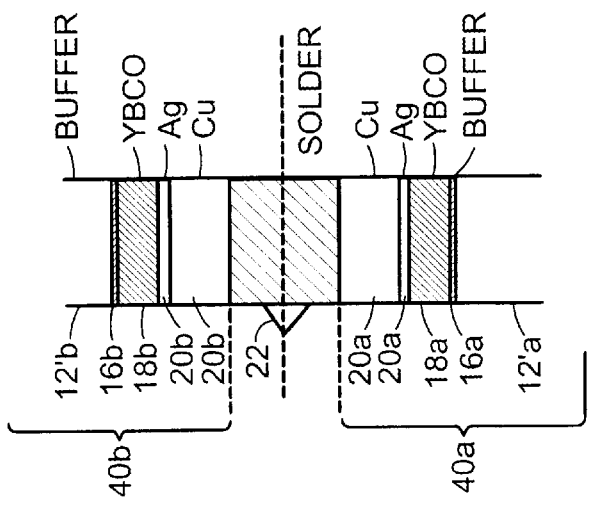
FIG. 3B illustrates an expanded view of FIG. 3A.
Figure 3A:
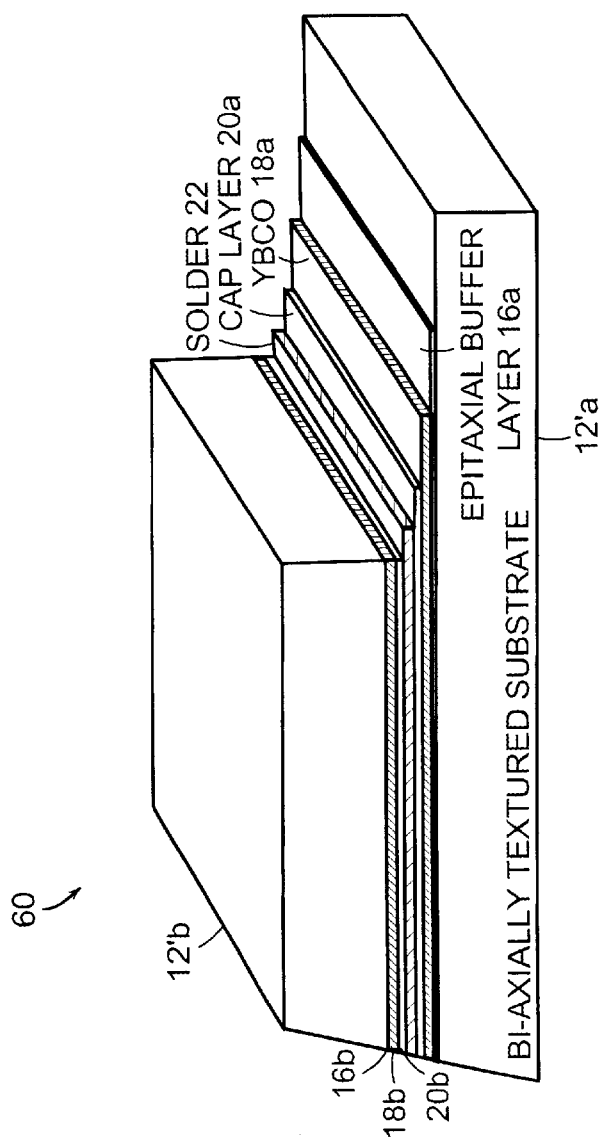
FIG. 3A illustrates an HTS coated conductor composite in accordance with the present invention.
Figure 4C:
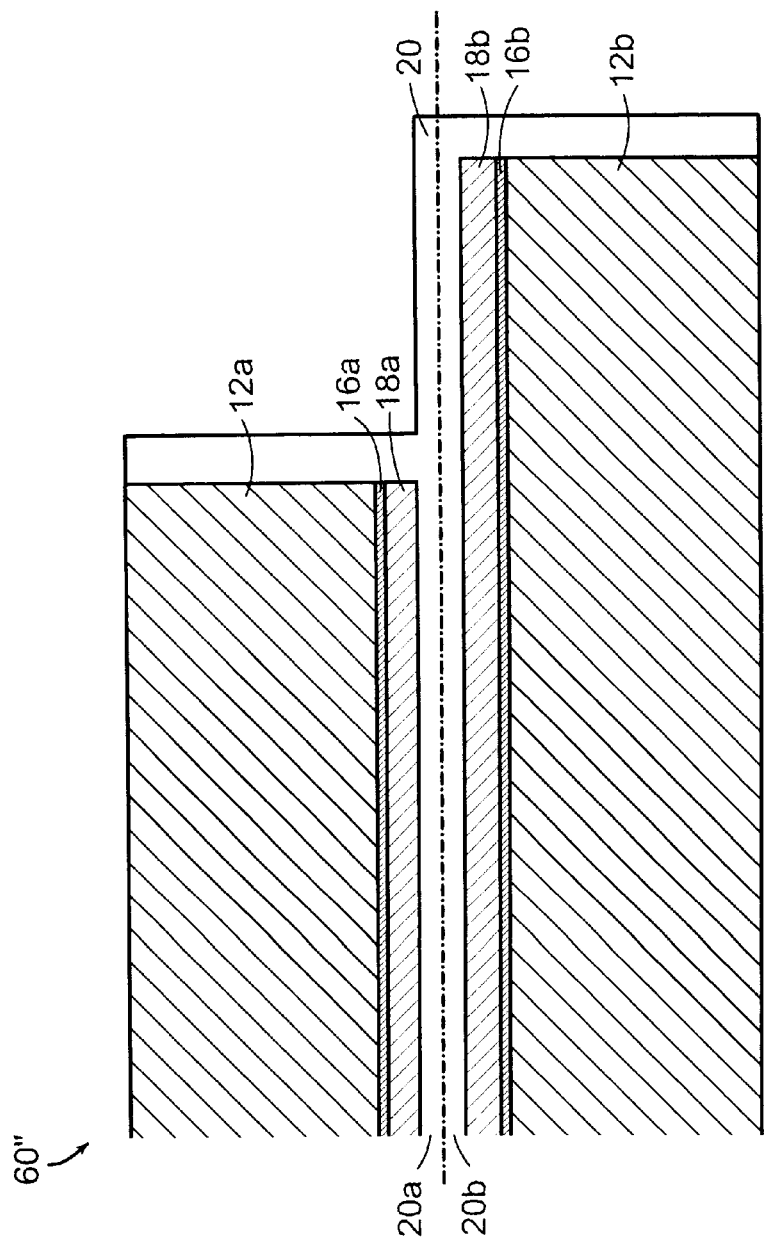
FIG. 4C illustrates another alternative embodiment of an HTS coated conductor composite in accordance with the present invention.

Referring now to FIG. 1A, an intermediate article 10 formed in accordance with the present invention is illustrated. Article 10 includes substrate 12. Substrates can be formed of a variety of materials.

The substrate can be formed of alloys having one or more surfaces that are biaxially textured (e.g., (113)[211]) or cube textured (e.g., (100)[001] or (100)[011]). The alloys a relatively low Curie temperature (e.g., at most about 80K, at most about 40K, or at most about 20K).

In certain embodiments, the substrate is a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

In some embodiments, the substrate contains more than two metals (e.g., a ternary alloy or a quarternary alloy). In these embodiments the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of impurities (e.g., less than about 0.1 atomic percent of impurities, less than about 0.01 atomic percent of impurities, or less than about 0.005 atomic percent of impurities).

An alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described in U.S. patent application Ser. No. 09/283,775, filed Mar. 31, 1999, and entitled "Alloy Materials;" U.S. patent application Ser. No. 09/283,777, filed Mar. 31, 1999, and entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference.

Some alloys can be produced with a very sharp cube texture. An example is the production of copper with 2–5 wt. % aluminum, more typically 4 wt. %, made with a powder metallurgy method (as disclosed in U.S. patent application Ser. No. 09/283,775, filed Mar. 31, 1999, and entitled "Alloy Materials;" U.S. patent application Ser. No. 09/283,777, filed Mar. 31, 1999, and entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference), using a copper sheath and a copper-aluminum core, deformed into a substrate by extrusion and rolling, and where the aluminum diffuses into the copper sheath during the texture anneal. This alloy substrate has been made with a cube texture of well over 99% and with a FWHM of 4–6 degrees. This FWHM value is considerably better than the FWHM value that can be attained in pure nickel, where the FWHM commonly reaches values of 8–10 degrees. However, the nickel remains an excellent surface for buffer and subsequent HTS deposition. A nickel surface with a lower FWHM value than 8–10 degrees remains desirable in order to enhance the critical current density in the HTS layer.

This nickel layer with a FWHM value of 4–6 degrees can be made by epitaxial deposition of the nickel onto an alloy such as the described copper/4 wt. % aluminum.

As also shown in FIG. 1A, intermediate article 10 includes intermediate layer 14. Layer 14 can be formed of a variety of materials as discussed above and can be deposited on substrate 12 using various techniques. For example, intermediate layer 14 can be deposited on substrate 12 by thermal evaporation, sputtering, electroplating (with or without electrodes) and e-beam evaporation.

In preferred embodiments and as discussed above, layer 14 is therefore an intermediate metal layer that does not oxidize under epitaxial film deposition conditions.

A buffer layer 16 is deposited on layer 14. Buffer layer 14 is preferably an epitaxially grown buffer layer(s) on a DeTex substrate.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4%$H_2$—Ar) is believed to be the result of an incomplete removal of the organic components of the precursor film. The presence of carbon-containing contaminants $C_xH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions.

These methods are described in U.S. patent application Ser. No. 60/672,513, filed on even date herewith, and entitled "Enhanced Purity Oxide Layer Formation," which is hereby incorporated by reference.

Layer 14 can be formed of any material capable of supporting layer 16. For example, layer 14 can be formed of a buffer layer material. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $LaNiO_3$, $Gd_2O_3$, $LaCuO_3$, $SrRuO_3$, $NdGaO_3$, $NdAlO_3$ and nitrides as known in the art. A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, an epitaxial buffer layer can be formed using a low vacuum vapor deposition process (e.g., a process performed at a pressure of at least about $1\times10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1\times10^{-3}$ Torr, such as less than about $1\times10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1\times10^{-3}$ Torr, at least about 0.1 Torr, or at least about 1 Torr) at a surface temperature below the temperature used to grow the epitaxial layer using physical vapor deposition at a high vacuum (e.g., at most about $1\times10^{-4}$ Torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022, 832, issued Feb. 8, 2000, and entitled "Low Vacuum Process for Producing Superconductor Articles with Epitaxial Layers;" and/or U.S. patent application Ser. No. 09/007,372, filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. The intermediate layer is deposited prior to buffer layer deposition however. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in U.S. patent application Ser. No. 09/500,701, filed on Feb. 9, 2000, and entitled "Oxide Layer Method," and U.S. patent application Ser. No. 09/615, 669, filed on even date herewith, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 50 nanometers thick) is deposited (e.g., using electron beam evaporation) onto the intermediate layer or substrate surface. A layer of YSZ (e.g., from about 0.2 micron to about 1 micron thick, such as about 0.5 micron thick) is deposited onto the surface of the $Y_2O_3$ or $CeO_2$ layer using sputtering (e.g, using magnetron sputtering). A $CeO_2$ layer (e.g., about 20 nanometers thick) is deposited (e.g, using magnetron sputtering) onto the YSZ surface. The surface of one or more of these layers can be chemically and/or thermally conditioned as described herein.

In certain embodiments, the underlying layer (e.g., a buffer layer or a different superconductor layer) can be conditioned (e.g., thermally conditioned and/or chemically conditioned) so that the superconductor layer is formed on a conditioned surface. The conditioned surface of the underlying layer can be biaxially textured (e.g., (113)[211]) or cube textured (e.g., (100)[011] or (100)[011]), have peaks in an X-ray diffraction pole figure that have a full width at half maximum of less than about 20° C (e.g., less than about 15° C, less than about 10° C, or from about 5° to about 10° C), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature with or without chemical conditioning to affect changes in the surface of a material layer, such as a buffer layer or a superconductor material layer, so that the resulting surface exhibits one or more of the above noted properties. Preferably, thermal conditioning occurs in a controlled environment (e.g., controlled gas pressure, controlled gas environment and/or controlled temperature).

Thermal conditioning can include heating the surface of the underlying layer to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments (e.g., an oxidizing gas environment, a reducing gas environment, or an inert gas environment).

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539–574, Lattice Press, Sunset Park, Calif., 1986.

Alternatively or additionally, chemical conditioning can involve solution phase techniques, such as disclosed in *Metallurgy and Metallurgical Engineering Series*, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

This method can be used to form multiple buffer layers (e.g., two, three, four, or more buffer layers), with one or more of the buffer layers having a conditioned surface.

The method can also be used to form multiple superconductor layers, with one or more of the superconductor layers having a conditioned surface. For example, a superconductor layer can be formed and then thermally and/or chemically conditioned as described above. An additional superconductor layer can then be formed on the conditioned surface of the first superconductor layer. This process can be repeated as many times as desired.

These methods are described in U.S. Provisional Patent Application No. 60/166,140, filed Nov. 18, 1999, and entitled "Multi-Layer Articles and Methods of Making Same," and U.S. patent application Ser. No. 09/615,999, filed on even date herewith, and entitled "Multi-layer Articles and Methods of Making Same," both of which are hereby incorporated by reference.

In certain embodiments, the superconductor layer can be formed from a precursor composition that has a relatively small amount of free acid. In aqueous solutions, this can correspond to a precursor composition with a relatively neutral pH (e.g., neither strongly acidic nor strongly basic). The precursor composition can be used to prepare multi-layer superconductors using a wide variety of materials which can be used as the underlying layer on which the superconductor layer is formed.

The total free acid concentration of the precursor composition can be less than about $1 \times 10^{-3}$ molar (e.g., less than about $1 \times 10^{-5}$ molar or about $1 \times 10^{-7}$ molar). Examples of free acids that can be contained in a precursor composition include trifluoroacetic acid, acetic acid, nitric acid, sulfuric acid, acids of iodides, acids of bromides and acids of sulfates.

When the precursor composition contains water, the precursor composition can have a pH of at least about 3 (e.g., at least about 5 or about 7).

In some embodiments, the precursor composition can have a relatively low water content (e.g., less than about 50 volume percent water, less than about 35 volume percent water, less than about 25 volume percent water).

In embodiments in which the precursor composition contains trifluoroacetic acid and an alkaline earth metal (e.g., barium), the total amount of trifluoroacetic acid can be selected so that the mole ratio of fluorine contained in the precursor composition (e.g., in the form of trifluoroacetate) to the alkaline earth metal (e.g., barium ions) contained in the precursor composition is at least about 2:1 (e.g., from about 2:1 to about 18.5: 1, or from about 2:1 to about 10:1).

Superconducting articles formed from such precursor compositions can include more than one superconductor layer (e.g., two superconductor layers disposed on each other). The combined thickness of the superconductor layers can be at least about one micron (e.g., at least about two microns, at least about three microns, at least about four microns, at least about five microns, or at least about six microns). The combined critical current density of the superconductor layers can be at least about $5 \times 10^5$ Amperes per square centimeter (e.g., at least about $1 \times 10^6$ Amperes per square centimeter, or at least about $2 \times 10^6$ Amperes per square centimeter).

In general, the precursor compositions can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the precursor compositions. Such compounds include, for example, salts (e.g., nitrates, acetates, alkoxides, iodides, sulfates and trifluoroacetates), oxides and hydroxides of these metals.

These methods and compositions are described in U.S. Provisional Patent Application Serial No. 60/166,297, filed on Nov. 18, 1999, and entitled "Superconductor, Articles and Compositions and Methods for Making Same," and U.S. patent application Ser. No. 09/616,810, filed on even date herewith, and entitled "Superconductor Articles and Compositions and Methods for Making Same," both of which are hereby incorporated by reference.

In certain embodiments, a precursor solution is formed of an organic solution containing metal trifluoroacetates prepared from powders of $BaCO_3$, $YCO_3.3H_2O$ and $Cu(OH)_2CO_3$ combined and reacted using methods known to those skilled in the art. For example, the powders can be combined in a 2:1:3 ratio with between 20–30% (5.5–6.0 M) excess trifluoroacetic acid in methyl alcohol and then refluxed (e.g., for approximately four to ten hours) to produce a solution substantially 0.94 M based on copper content.

The precursor solution is then applied to a surface (e.g., a buffer layer surface), such as by spin coating or other techniques known to those skilled in the art.

After application to the surface (e.g, the buffer layer surface), the precursor solution is heat treated. Generally, the solution is heated at a rate of from about 0.5° C. per minute to about 10° C. per minute in moist oxygen (e.g., having a dew point in the range of from about 20° C. to about 75° C.) to a temperature in the range of from about 300° C. to about 500° C. The coating is then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in static dry oxygen.

These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

In some embodiments, a metal oxyfluoride is deposited using one or more standard techniques, such as metalorganic solution deposition, metalorganic chemical vapor deposition, reactive evaporation, plasma spray, molecular beam epitaxy, laser ablation, ion beam sputtering, electron beam evaporation, depositing a metal trifluoroacetate coating and decomposing the coating as described herein. Multiple layers of metal oxyfluoride may be deposited.

Other constituent metallic elements of the desired oxide superconductor are also deposited in substantially stoichiometric proportions.

The metal oxyfluoride is converted into an oxide superconductor at a rate of conversion selected by adjusting temperature, vapor pressure of gaseous water or both. For example, the metal oxyfluoride can be converted in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyfluoride can be in the range of from about 700° C. to about 900° C. (e.g., from about 700° C. to about 835° C.). The processing gas preferably contains from about 1 volume percent oxygen gas to about 10 volume percent oxygen gas.

These methods are described in PCT Publication No. WO 98/58415, published on Dec. 23, 1998, and entitled "Controlled Conversion of Metal Oxyfluorides into Superconducting Oxides," which is hereby incorporated by reference.

In certain embodiments, the preparation of the superconductor layer includes using a precursor composition containing a trifluoroacetate salt of one or more metals and a controlled total water content (e.g., controlled content of liquid water in the precursor composition and controlled content of water vapor in the surrounding environment) present when treating the precursor composition to form an intermediate of the superconductor layer (e.g., a metal oxyfluoride intermediate of the superconductor layer). For example, the precursor composition can have a relatively low water content (e.g., less than about 50 volume percent water, less than about 35 volume percent water, or less than about 25 volume percent water) and/or a relatively high solids content, whereas the surrounding gas environment can have a relatively high vapor pressure of water (e.g., from about 5 Torr to about 50 Torr water, from about 5 Torr to about 30 Torr water, or from about 10 Torr to about 25 Torr water). The superconductor layer intermediate (e.g., metal oxyfluoride intermediate) can be formed in a relatively short period of time (e.g., less than about five hours, less than about three hours, or less than about one hour).

Treating the precursor composition can include heating the precursor composition from an initial temperature (e.g., room temperature) to a temperature of from about 190° C. to about 215° C. (e.g., about 210° C.) at a rate of at least about 50° C. per minute (e.g., at least about 8° C. per minute, or at least about 10° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

Heating is then continued to a temperature of from about 220° C. to about 290° C. (e.g., about 220° C.) at a rate of from about 0.05° C. per minute to about 0.4° C. per minute (e.g., from about 0.1° C. per minute to about 0.4° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form an intermediate of the superconductor material (e.g., a metal oxyfluoride intermediate). The nominal partial pressure of oxygen can be, for example, from about 0.1 Torr to about 760 Torr.

The intermediate can be heated to form the desired superconductor layer. For example, the intermediate can be heated to a temperature of from about 700° C. to about 825° C. in an environment containing from about 0.1 Torr to about 50 Torr oxygen and from about 0.1 Torr to about 150 Torr water vapor (e.g., about 12 Torr water vapor) with the balance being, for example, nitrogen and/or argon.

The method can result in a well-ordered superconductor layer (e.g., biaxially textured or cube textured) having a relatively high critical current density (e.g., at least about $5 \times 10^5$ Amperes per square centimeter).

These methods are described in U.S. Provisional Patent Application Serial No. 60/166,145, filed on Nov. 18, 1999, and entitled "Methods and Compositions for Making a Multi-Layer Article," and U.S. patent application Ser. No. 09/615,991, filed on even date herewith, and entitled "Methods and Compositions for Making a Multi-layer Article," both of which are hereby incorporated by reference.

In certain embodiments, a metal oxyfluoride intermediate of a superconductor material can be prepared using a process that involves relatively few temperature ramps (e.g., less than three ramps, such as two ramps).

Alternatively or additionally, forming the metal oxyfluoride can include one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature (e.g., at least about 50° C., at least about 100° C., at least about 200° C., at least about 215° C., from about 215° C. to about 225° C., about 220° C.).

Formation of the metal oxyfluoride intermediate can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 17 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr).

Generally, the metal oxyfluoride is formed by disposing a composition (e.g., a precursor solution) on a surface (e.g., a substrate surface, a buffer layer surface or a superconductor layer surface) and heating the composition. The methods of disposing the composition on the surface include spin coating, dip coating, web coating and other techniques known in the art.

Typically, in an initial decomposition step, the initial temperature in this step is about room temperature, and the final temperature is from about 215° C. to about 225° C. using a temperature ramp of 10° C. per minute or less. During this step, the partial pressure of water vapor in the nominal gas environment is preferably maintained at from about 17 Torr to about 40 Torr. The partial pressure of oxygen in the nominal gas environment can be maintained at from about 0.1 Torr to about 760 Torr. The temperature and nominal gas environment are then held substantially constant for a relatively long period of time.

After this time period, the gas environment is changed to a relatively dry gas environment (e.g., less than about one Torr water vapor, less than about 0.1 Torr water vapor, less than about 10 milliTorr water vapor, five milliTorr water vapor) while maintaining the temperature substantially constant. The temperature and nominal gas environment are then held substantially constant for a relatively long period of time.

After this time period, the nominal gas environment is maintained substantially constant and heating is continued to a temperature sufficient to form the metal oxyfluoride intermediate (e.g., about 400° C.). This step is preferably performed using a temperature ramp of 10° C. per minute or less.

The metal oxyfluoride intermediate can then be heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon. Preferably, the metal oxyfluoride intermediate has a relatively low defect density.

These methods are described in U.S. patent application Ser. No. 09/616,811, filed on even date herewith, and entitled "Methods of Making A Superconductor," which is hereby incorporated by reference.

In certain embodiments, the superconducting layer can be formed from solid-state, or semi solid state, precursor materials deposited in the form of a dispersion. These precursor compositions allow for example the substantial elimination of $BaCO_3$ formation in final YBCO superconducting layers, while also allowing control of film nucleation and growth.

Two general approaches are presented. for the formulation of precursor compositions. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 $A/cm^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Ba-trifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about I to 10 microns, preferably from about 1 to 5 microns, more preferably from about 2 to 4 microns.

More details are provided in U.S. patent application Ser. No. 09/500,717, filed on Feb. 9, 2000, and entitled "Coated Conductor Thick Film Precursor," which is hereby incorporated by reference in its entirety.

In particular embodiments, methods can be employed to minimize the formation of undesirable a-axis oriented oxide layer grains, by inhibiting the formation of the oxide layer until the required reaction conditions are attained.

Conventional processes developed for decomposition and reaction of fluoride-containing precursors use a constant, and low, non-turbulent flow of process gas that is introduced into the decomposition furnace in an orientation that is parallel to the film surface, resulting in a stable boundary layer at the film/gas interface. In the apparatus types typically used for oxide layer precursor decomposition and reaction, the diffusion of gaseous reactants and products through this gas/film boundary layer appears to control the overall reaction rates. In thin, small area films (for example, less than about 0.4 microns thick and less than about a square centimeter), the diffusion of $H_2O$ into the film and the diffusion of HF out of the film occur at rates such that the formation of the $YBa_2Cu_3O_{7-x}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-x}$ phase, resulting in reduced crystallographic texture, lower density, and reduced critical current density. Thus, the overall rate of $YBa_2Cu_3O_{7-x}$ phase formation is determined, to a significant extent, by the diffusion of gases through the boundary layer at the film surface.

One approach to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus, the concentration of the gaseous products/reactants in the film is not controlled by the diffusion through the gas/film surface boundary layer condition, but rather by diffusion through the film. In order to minimize the nucleation of a-axis $YBa_2Cu_3O_{7-x}$ oriented grains on a substrate surface, the formation of the $YBa_2Cu_3O_{7-x}$ phase is inhibited until desired process conditions are reached. For example, the formation of the $YBa_2Cu_3O_{7-x}$ phase can be inhibited until desired process temperature is reached.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. Thus, the rate of formation of $YBa_2Cu_3O_{7-x}$ and epitaxial texture formation can be increased at high temperature, while minimizing the amount of unwanted a-axis nucleation and growth at low temperature during ramp up. According to these processes, a-axis nucleated grains are desirably present in an amount of less than about 1%, as determined by scanning electron microscopy.

More details are provided in U.S. patent application Ser. No. 09/616,566, filed on even date herewith, and entitled "Control of Oxide Layer Reaction Rates," which is hereby incorporated by reference.

In some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture provides improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure. The cap layer can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

In particular embodiments, tensile strain on the superconducting layers can be minimized by providing the superconducting layer within a neutral mechanical axis zone. A "neutral mechanical axis" of a flexible material in the form of a tape of layered materials is a plane in the plane of the tape, coplanar with the layers of the tape, in which tensile strain experienced upon bending the material in a direction normal to the plane is zero. An operational layer centered on this axis will experience minimum tensile strain. A "neutral mechanical axis zone" is a region where the maximum strain experienced by the superconducting layer is less than that which would lead to degraded performance. The criterion for positioning the operational layer within the neutral mechanical axis zone is derived by balancing the moments in bending. This is done by properly specifying the thicknesses, positions, and Young's modulus of the laminate layer or layers; laminate layers are those layers which are non-operational, and can include substrate, buffer and cap layers, for example.

More details are provided in U.S. Provisional Patent Application Serial No. 60/145,468, filed on Jul. 23, 1999, and entitled "Enhanced High Temperature Coated Superconductors," and U.S. patent application Ser. No. 09/617,518, filed concurrently herewith, and entitled "Enhanced High Temperature Coated Superconductors," both of which are hereby incorporated by reference in its entirety.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in U.S. patent application Ser. No. 09/500,718, filed on Feb. 9, 2000, and entitled "Coated Conductors with Reduced AC Loss," which is hereby incorporated by reference in its entirety.

The invention thus provides novel superconductors manufactured with an improved process that allow the use of a slight offset in stack up of coated conductor tape elements to provide for effective current transfer from tape to tape. In addition, stability of the conductor is enhanced by current sharing across filaments and due to the insert of normal metal at interface. The invention further allows for increased mechanical integrity of conductor stack up due to positioning of the HTS layers near the conductor center line and an ability to splice and terminate stacked HTS coated conductors without splitting.

Methods for producing biaxially textured buffer layer films on complex biaxially textured alloy substrates and articles formed in accordance therewith have been described. The methods are promising for use as a structural template for the deposition of many materials without the need of single crystalline substrates. The transient film process allows the use of known economical deposition techniques on substrates that may otherwise not be viable due to extreme process difficulties.

The invention will be further described in the following examples, which do not limit the scope of the invention described in the claims.

EXAMPLES

The following examples illustrate particular properties and advantages of particular embodiments according to the invention.

Example 1

Figure 7:
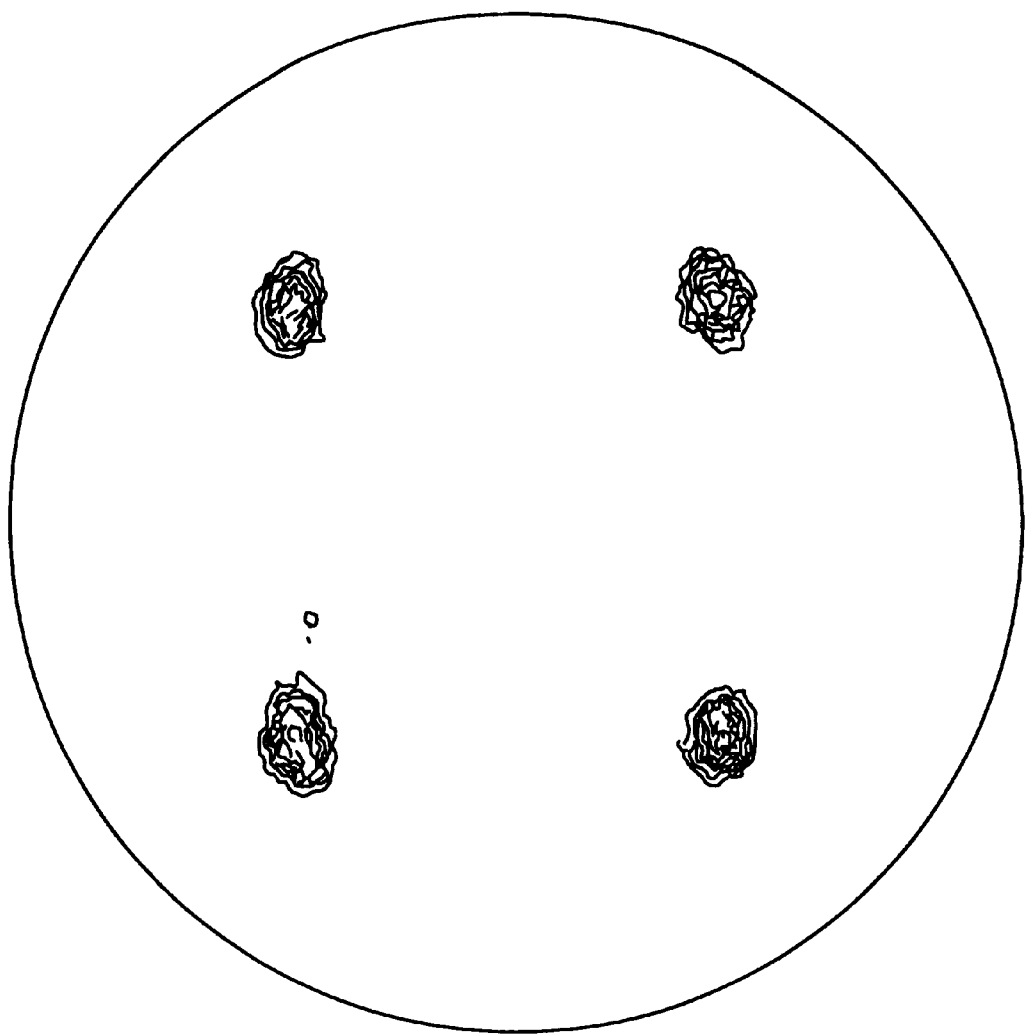
FIG. 7 shows a pole figure of an underlying Cu-35%Ni substrate.
Figure 8:
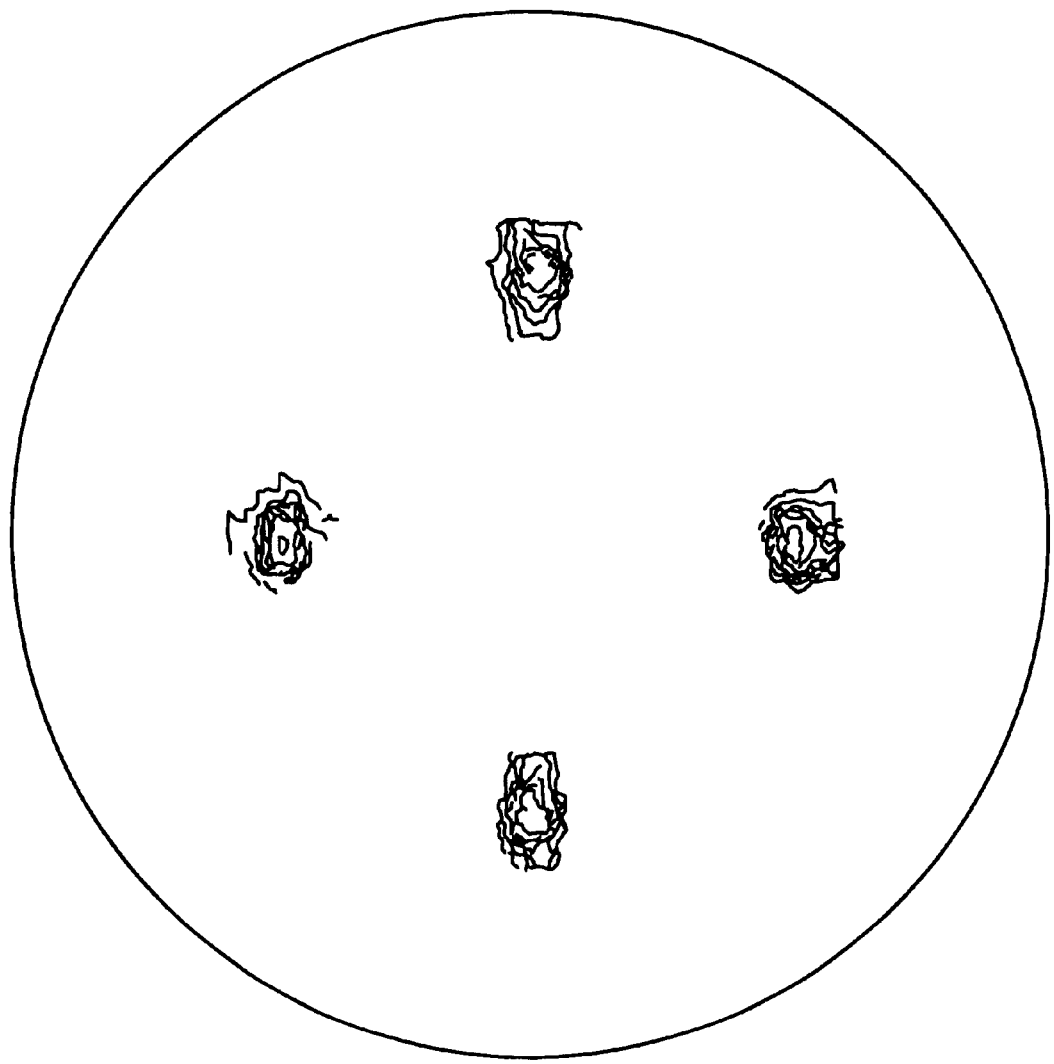
FIG. 8 shows a pole figure of a thermally evaporated Ni layer deposited on a Cu-35% Ni substrate.

An alloy consisting of 65 wt % Cu and 35 wt % Ni is made into a cube textured substrate tape. The substrate tape, measuring 9 mm×127 mm and being 0.1 mm thick, is placed on an orbital stage. which is located under the Ni evaporation source, all situated inside a bell jar. The Ni evaporation source consists of a 99.999% Ni strip, which is clamped between two electrodes. The bell jar is evacuated to a pressure of less than $10^{-5}$ Torr. A current is passed through the Ni strip which is resistively heated to about 1300° C. which is sufficient for Ni evaporation. The sample is rotated to ensure even coverage of the sample with the condensed Ni. Ni evaporation is continued for 30 minutes, and a Ni film of about 100 nm in thickness is formed at the Cu35%Ni substrate surface. The substrate is removed from the evaporation chamber, and annealed in a reducing atmosphere (95% argon+5% hydrogen) to avoid oxidation of the Ni, for 1 hour at 600° C. The substrate acts as a template for the Ni film, which becomes cube textured as well, is well bonded to the substrate, but remains an identifiable, separate layer on top of the Cu35%Ni substrate. This is evident from X-ray diffraction data such as θ–2θ (theta 2-theta) scans which shows a (200) reflection separate from the Cu-35Ni (200) reflection. The texture of this Ni layer is determined from X-ray pole figure data. FIG. 7 shows the (111) pole figure of the underlying Cu-35%Ni substrate. FIG. 8 shows the (220) pole figure of the Ni layer, indicating a sharp cube textured Ni.

Example 2

Figure 9:
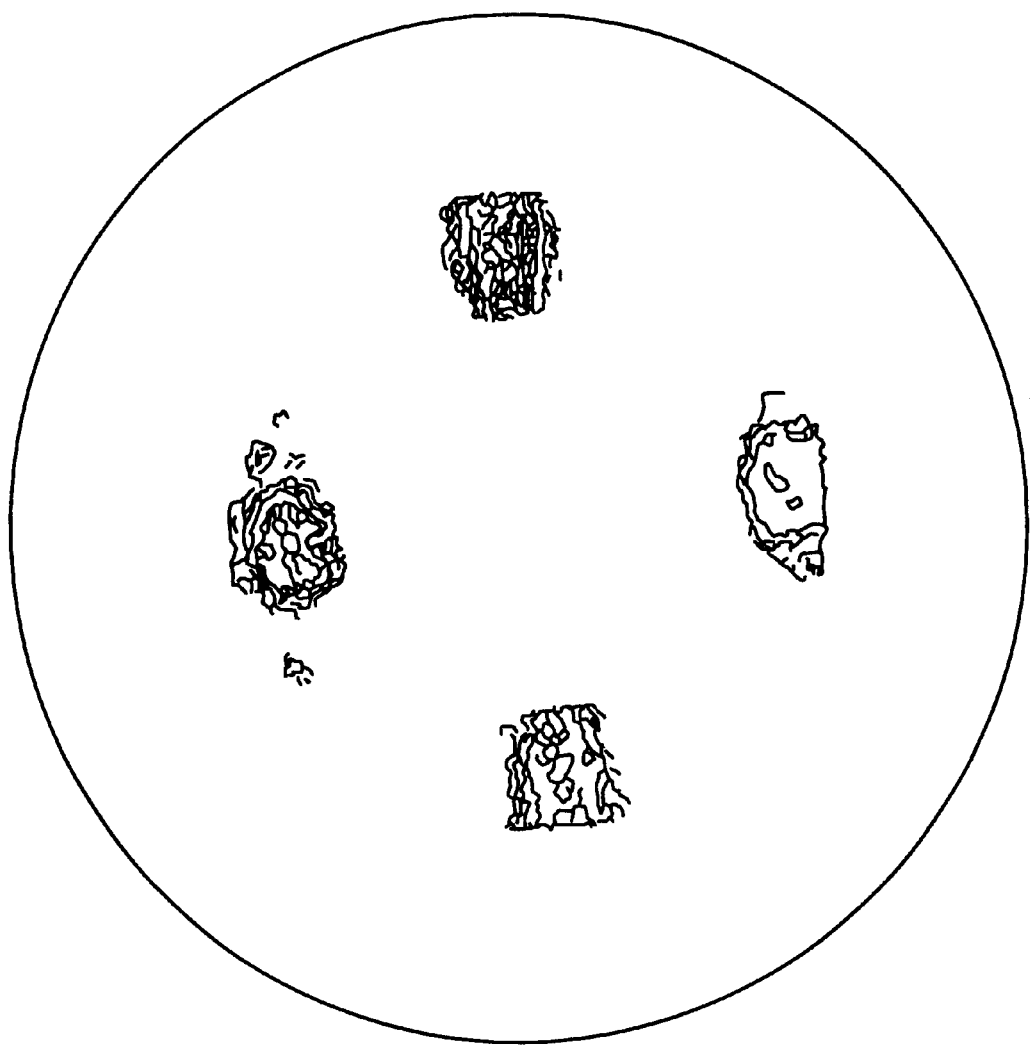
FIG. 9 shows a pole figure of an electroplated Ni layer on a Cu-35%Ni substrate.

An alloy consisting of 65 wt % Cu and 35 wt % Ni is made into a cube textured substrate tape. The tape is electroplated with Ni (using a so-called Watts bath) in a solution containing Ni-sulphate ($NiSO_4$), $NiCl_2$ and $H_3BO_3$. The current density is kept relatively low at 5 mA/cm$^2$ The final plate is 2 microns (2000 nm) thick. The plated substrate is annealed at 600° C. for 2 hours in 95% argon+5% hydrogen. The Ni plate remains as a distinct Ni layer. The Ni layer has a cube texture, as can be seen in the (220) pole figure in FIG. 9.

Example 3

Figure 10:
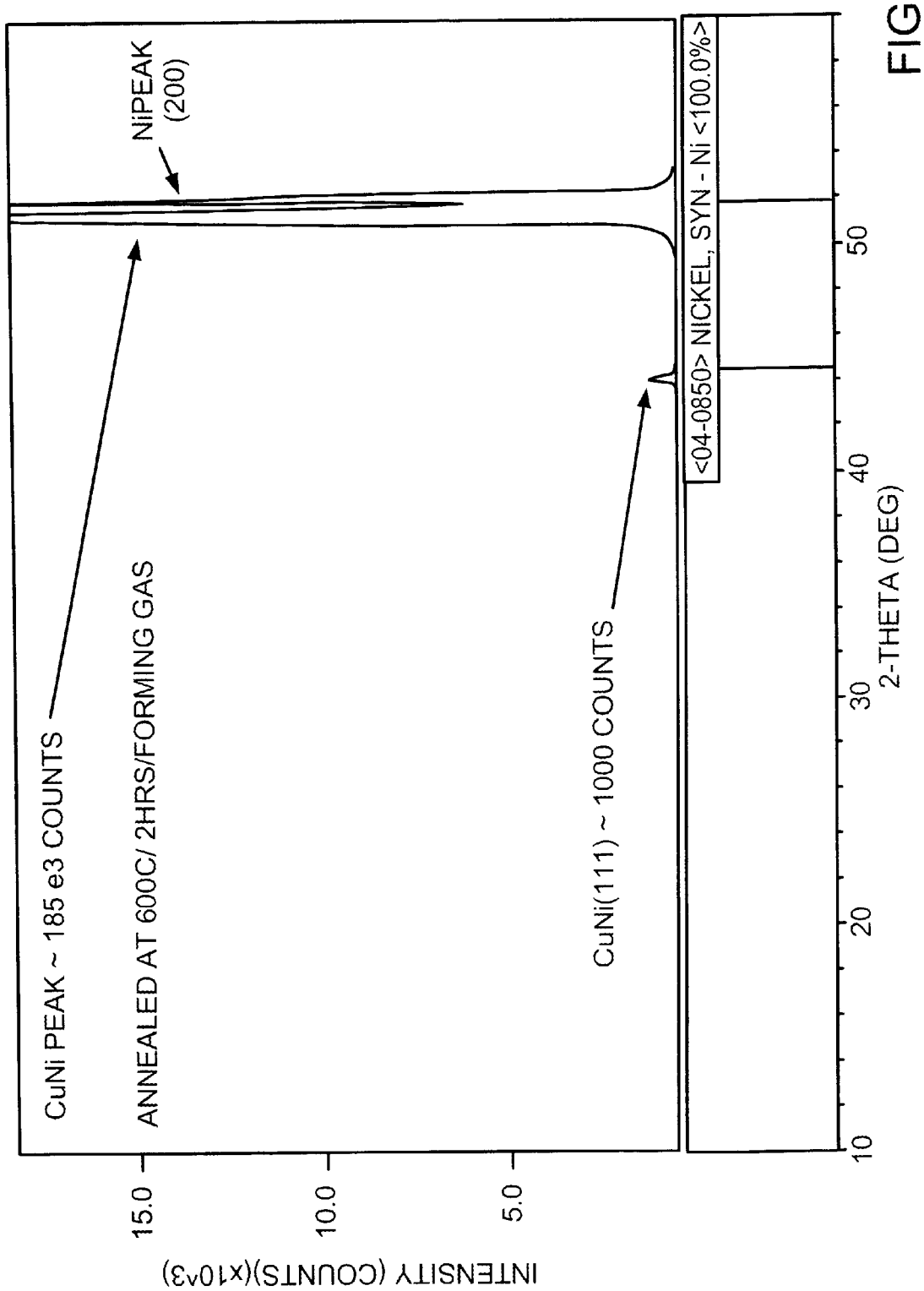
FIG. 10 shows a θ–2θ x-ray diffraction scan of a Ni-coated Cu-46%Ni substrate.
Figure 11:
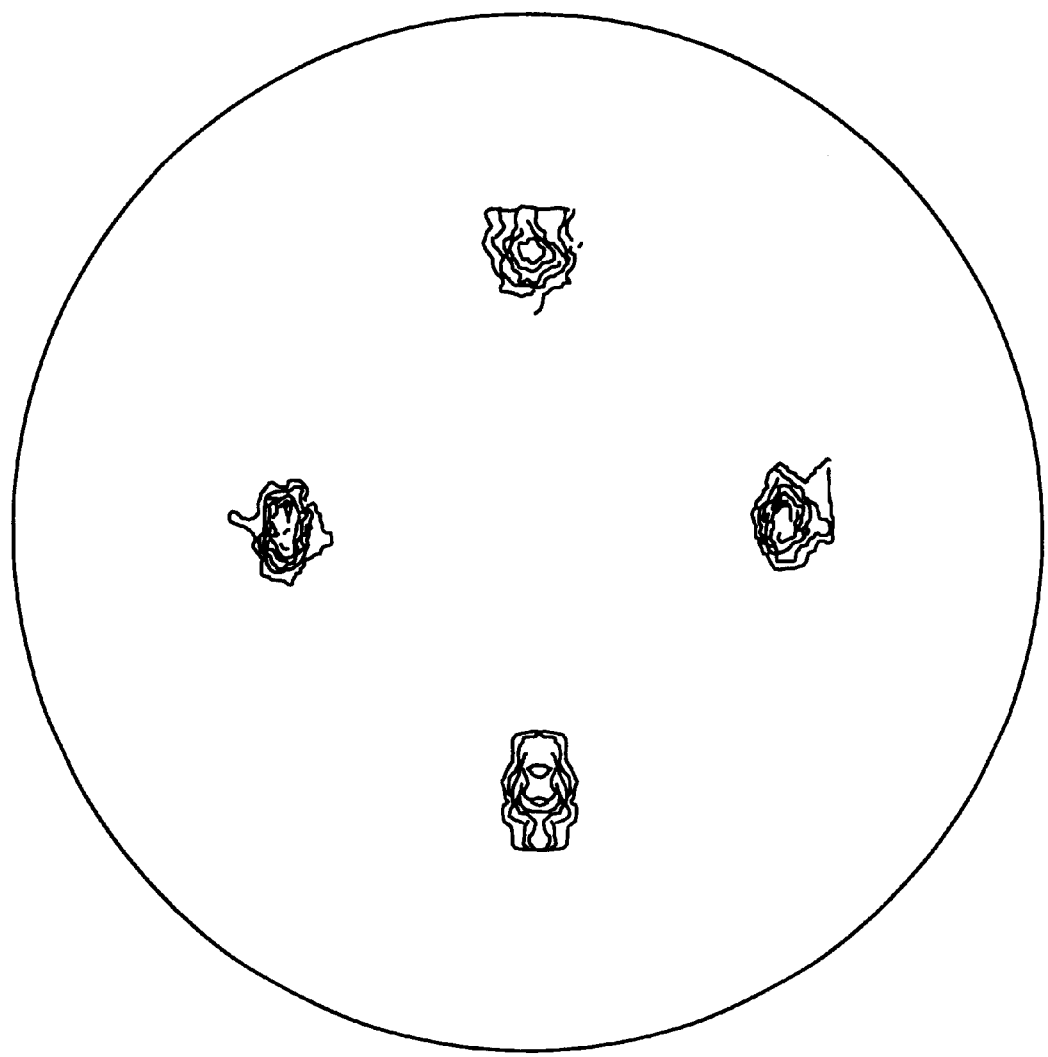
FIG. 11 shows a pole figure of a nickel layer on a Cu-46%Ni substrate.

An alloy consisting of 54wt % Cu and 46wt % Ni is made into a cube textured substrate tape. It is put in a vacuum chamber, and Ni is sputter deposited onto the substrate. The deposition rate is approximately 3.3 nm/minute. The deposition is continued for 90 minutes, resulting in a Ni layer thickness of 300 nm. The Ni coated substrate is annealed at 600° C. for 2 h in 95% argon+5% hydrogen to avoid oxidation of the Ni. FIG. 10 shows an X-ray diffraction θ–2θ scan. The strongest peak near 2-theta=52° is the (200) reflection of Cu-46%Ni. At slightly higher angle, one observes the (200) reflection of the Ni layer, showing that the layer remains distinct from the substrate. FIG. 11 shows the (220) pole figure of the Ni layer, showing that the Ni layer is indeed cube-textured, as is the underlying substrate.

Example 4

Figure 12:
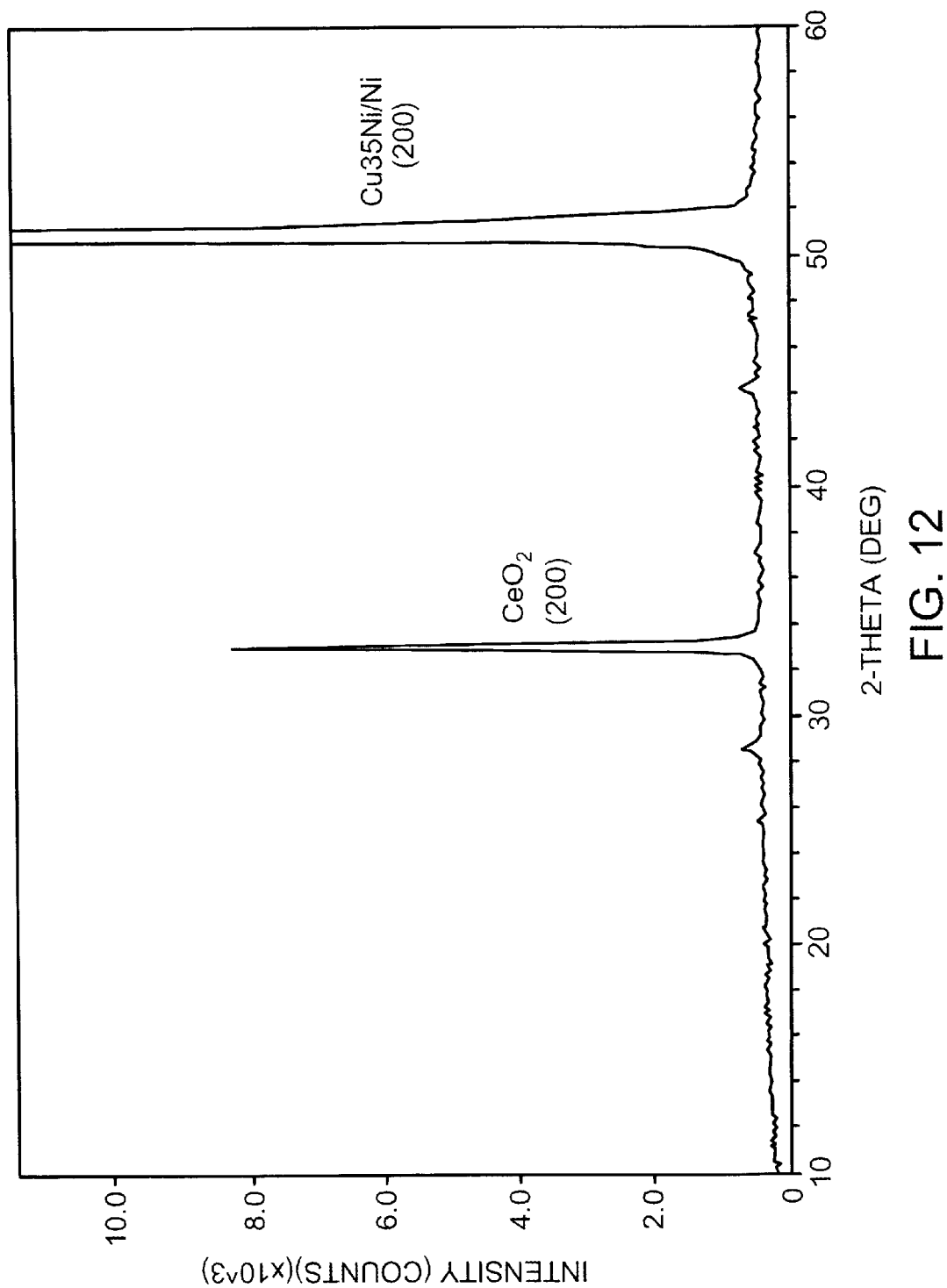
FIG. 12 illustrates an x-ray diffraction scan of a ceria (CeO$_2$) buffer layer deposited on a Ni coated Cu-35%Ni substrate.
Figure 13:
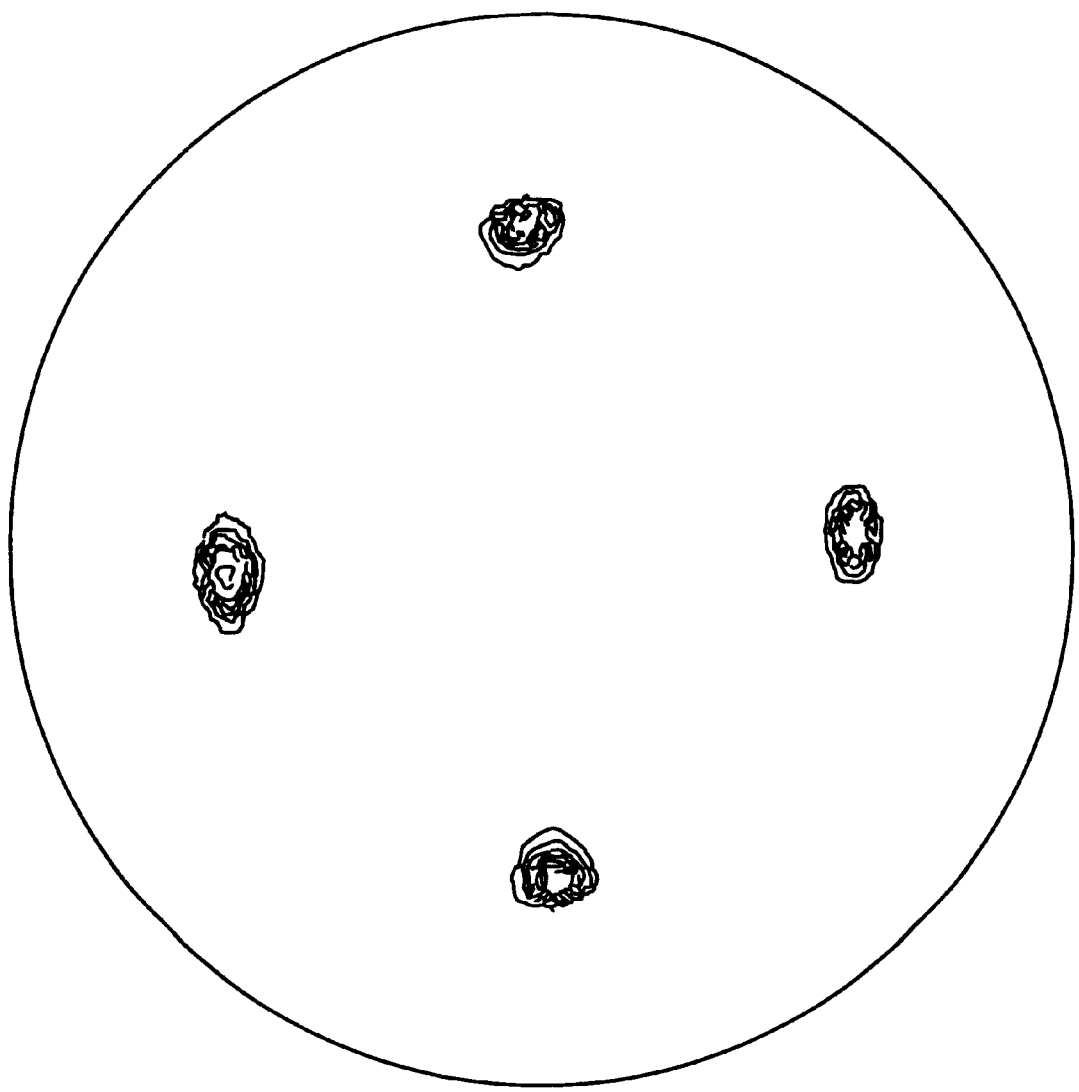
FIG. 13 illustrates a (111) pole figure of a ceria layer.

An alloy consisting of 65 wt % Cu and 35 wt % Ni is made into a cube textured substrate tape. The substrate tape is placed on an orbital stage that is located under the Ni evaporation source, all situated inside a bell jar. The Ni evaporation source consists of a 99.999% Ni strip that is clamped between two electrodes. The bell jar is evacuated to a pressure of less than about $10^{-5}$ Torr. A current is passed through the Ni strip that is resistively heated to about 1300° C., which is sufficient for Ni evaporation. The sample is rotated to ensure even coverage of the sample with the condensed Ni. Ni evaporation is continued for 60 minutes, and a Ni film of about 200 nm in thickness is formed at the Cu-35%Ni substrate surface. The substrate is removed form the evaporation chamber, and annealed in a reducing atmosphere (95% argon+5% hydrogen) to avoid oxidation of the Ni, for 2 hour at 600° C. The Ni coated sample is subsequently transferred to a sputter chamber. A 100 nm thick ceria layer is sputter deposited onto the Ni surface of the Cu-35%Ni substrate at 600° C., in 10 mTorr of 95% argon+ 95% hydrogen atmosphere. It is cooled in the same atmosphere to 150° C. and then taken from the chamber. The resulting ceria layer is bi-axially textured. FIG. 12 shows a theta-two theta X-ray diffraction scan. FIG. 13 shows the (111) pole figure of the ceria layer. The FWHM value is 9 degrees or less.

Example 5

A Cu-46wt %Ni-1.0 wt %Al is cast as a 3" diameter, 14" long ingot. The ingot is machined to a 2.5" diameter billet. The billet is heated and extruded to a 1.25" diameter. The extrudate is machined to remove scale, and is subsequently homogenized at 950° C. for 16 hrs, under vacuum. The bar is then swaged to 0.75" in diameter. The swaged bar is ground using center-less grinding to a diameter of 0.69". It is subsequently rolled to a strip with a 0.32" thickness, at 5% per pass, at room temperature. The strip is recrystallized at 675° to induce a random texture. The grain size is 40 micrometers on average. The strip is rolled at 15% per pass to 0.08" and 10% per pass to 0.008" using 2H (2-high) rolling. The foil is annealed at 1000° C. for 1 hr to induce the cube texture.

Figure 14:
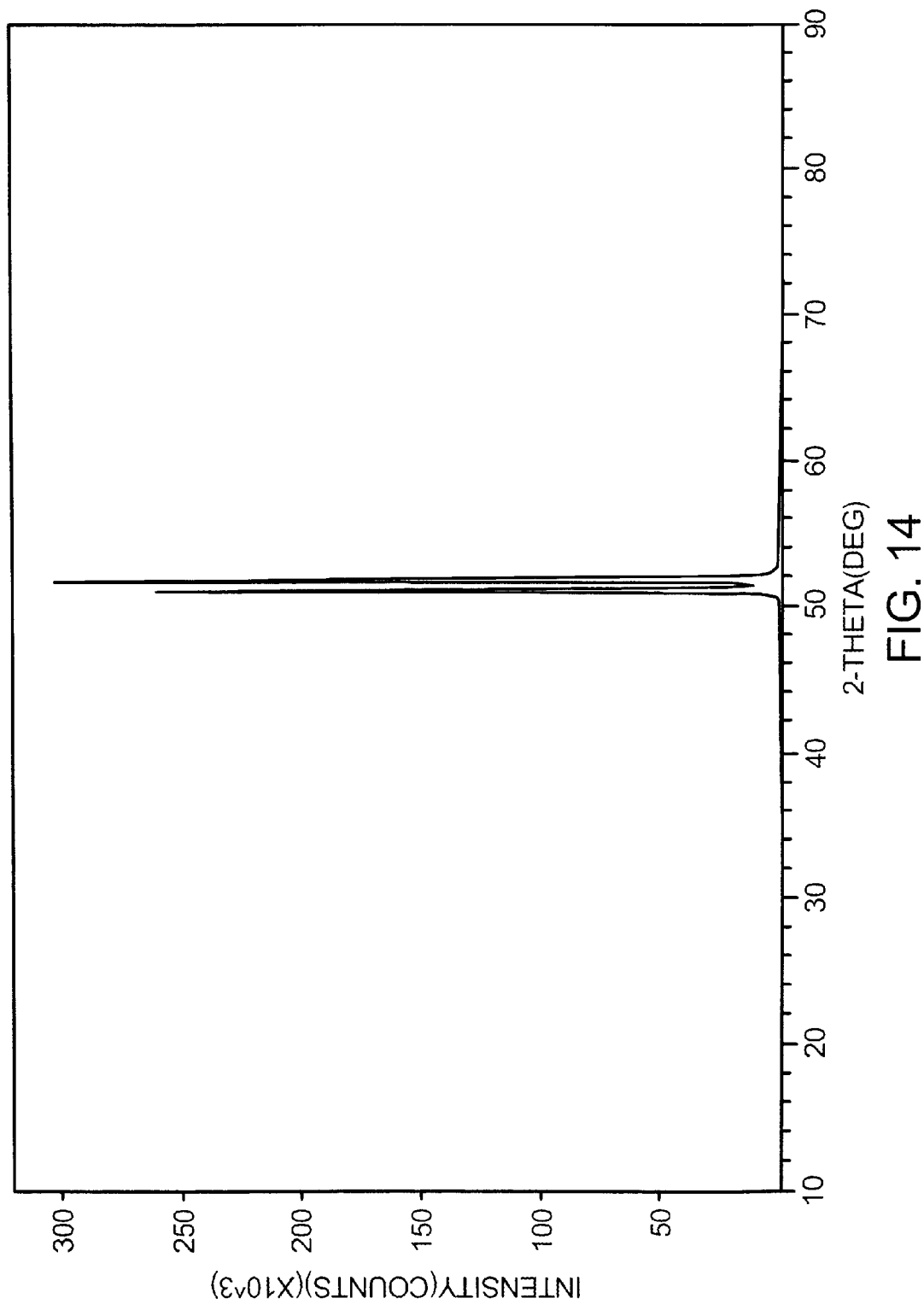
FIG. 14 is a θ–2θ x-ray diffraction scan of a Ni-coated CuNiAl substrate.

The texture-annealed foil is chemically etched to remove the alumina oxide scale which is formed at the surface during the texture anneal. As an etchant, a solution containing 50% acetic acid, 10% sulfuric acid, 10% orthophosphoric acid, and 30% nitric acid is used. Etching is done at room temperature. The strip is immediately transferred to the plating solution and forms the negative electrode. Rolled Ni (>99.9%) sheet is used as the positive electrode. The plating solution consists of water, 33% nickel sulfate, 4.5% nickel chloride, 3.8% boric acid, and 0.5% hydrogen peroxide. Ni is deposited at 43° C. at a current density of 5 mA/cm$^2$ for a 20 minute period, resulting in a 2 micrometer thick Ni layer. This low current density tends to favor a good Ni orientation, which develops a sharp cube texture with a cube-on-cube epitaxial relationship with the underlying CuNiAl substrate when the sample is subsequently annealed for two hours at 600° C. in forming gas (95% argon gas+5%hydrogen). FIG. 14 shows a theta-two-theta X-ray diffraction scan, showing a sharp texture. The Ni layer adheres well to the CuNiAl substrate, with no pores visible in perpendicular cross sections up to 10,000 magnification using a scanning electron microscope.

Example 6

Figure 15B:
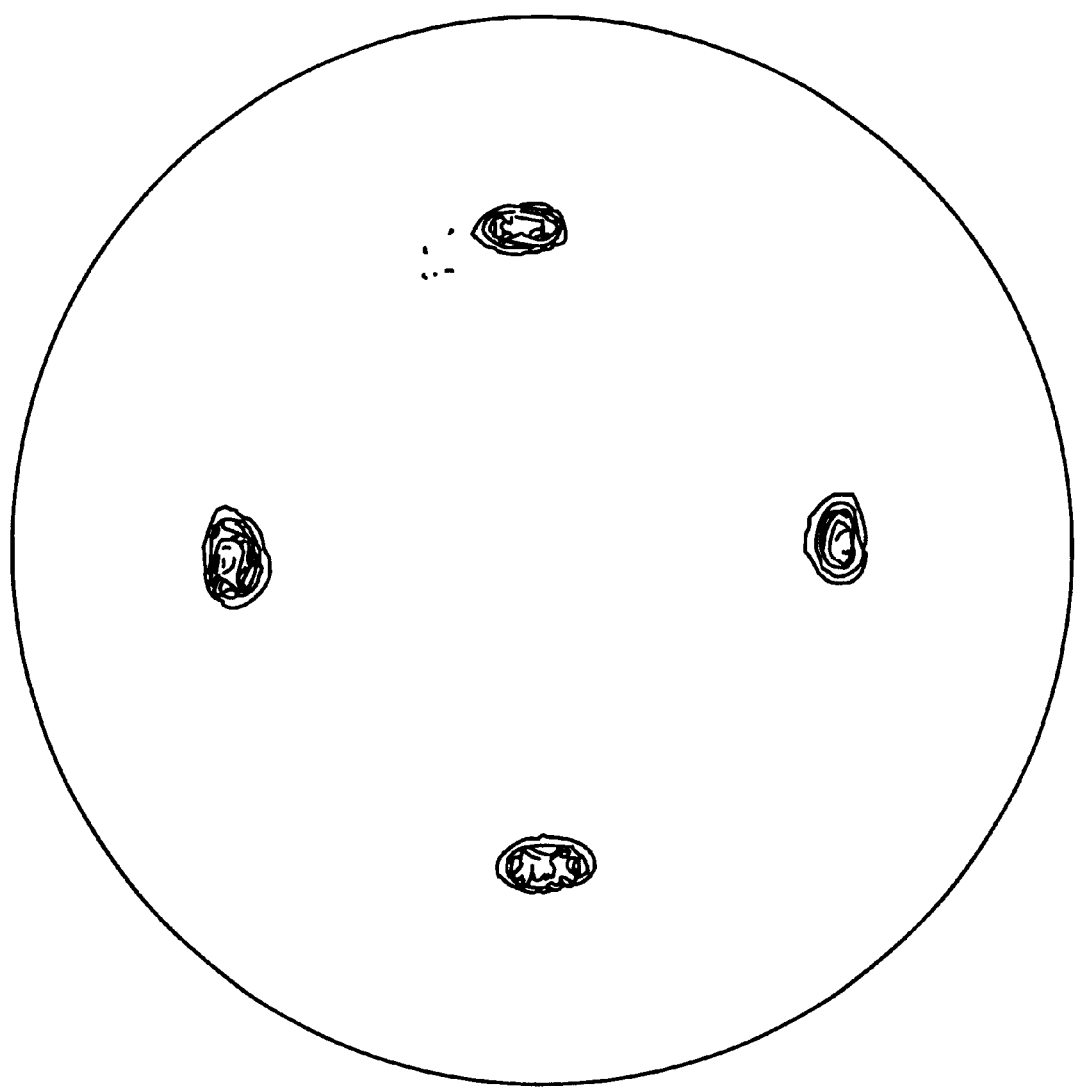
FIG. 15B is a pole figure showing the CeO$_2$ film.

A Ni-plated CuNiAl foil is formed, as in Example 5. The Ni-plated foil is transferred to a vacuum chamber and heated to 650° C. in forming gas (95% argon gas+5%hydrogen) for 45 minutes prior to sputter-deposition of about 25 nm CeO$_2$ at 650° C., at a rate of about 0.2 A/s, and a pressure of about 125 mTorr using a Ce target. FIGS. 15A and 15B respectively show a theta-two-theta X-ray diffraction and pole figure showing epitaxy of the CeO$_2$ film.

Example 7

A Cu-46wt %Ni-1.0 wt %Al is cast as a 3" diameter, 14" long ingot. The ingot is machined to a 2.5" diameter billet. The billet is heated and extruded to a 1.25" diameter. The extrudate is machined to remove scale, and is subsequently homogenized at 950° C. for 16 hrs, under vacuum. The bar is then swaged to 0.75" in diameter. The swaged bar is ground using center-less grinding to a diameter of 0.69". It is subsequently rolled to a strip with a 0.32" thickness, at 5% per pass, at room temperature. The strip is recrystallized at 675° to induce a random texture. The grain size is 40 microns on average. The strip is rolled at 15% per pass to 0.08" and 10% per pass to 0.008" using 2H (2-high) rolling. The foil is annealed at 1000° C. for 1 hr to induce the cube texture.

Figure 16:
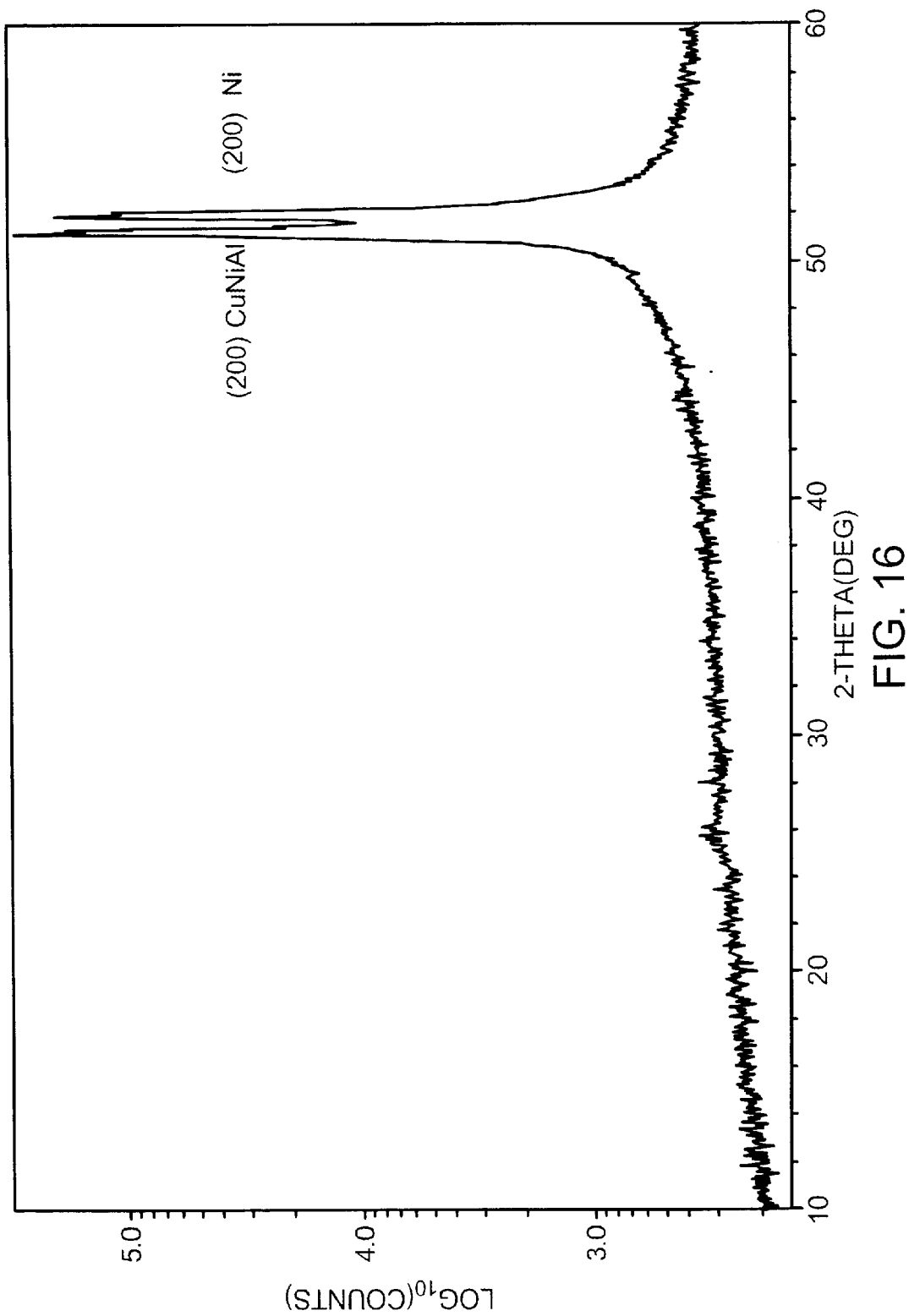
FIG. 16 θ–2θ x-ray diffraction scan of a Ni-coated CuNiAl substrate.

The texture-annealed foil is sputter etched at room temperature at 100–1000 eV for 18–90 minutes to remove the alumina oxide scale formed at the surface during the texture anneal. The strip is transferred to a vacuum chamber and a 2 micrometer thick layer of Ni is deposited on the foil in three steps: (1) Sputtering at about 25 C, at a power of about 200 W, and a pressure of about 125 mTorr for a 20 minute period, (2) Annealing at 625° C. in forming gas (95% argon gas+5%hydrogen) for a 60 minute period, and (3) Sputtering at about 625° C., at a power of about 200 W, and a pressure of about 125 mTorr for an additional 60 minute period. FIG. 16 shows a theta-two-theta X-ray diffraction scan, showing a sharp texture.

Example 8

Figure 17A:
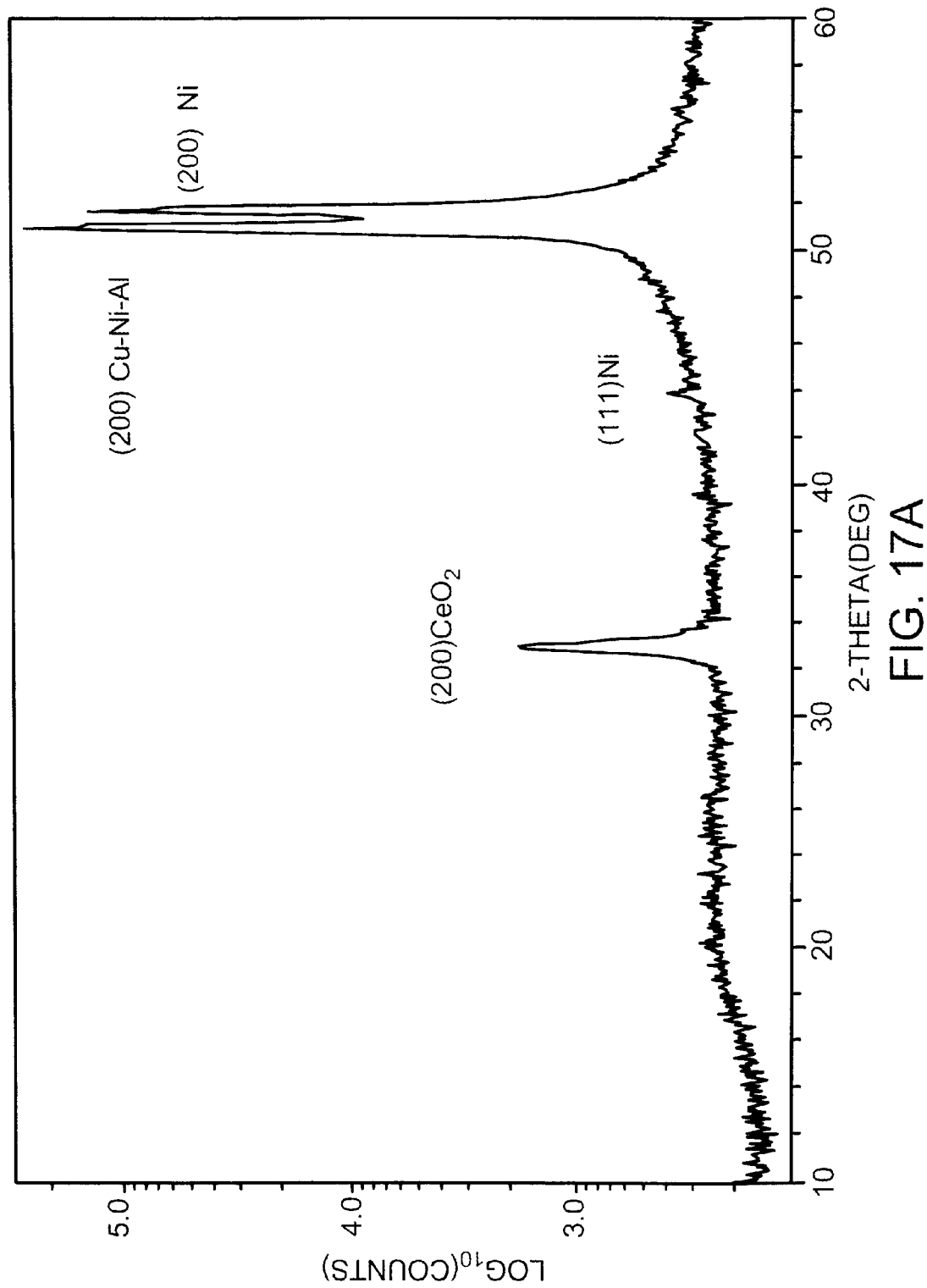
FIG. 17A is θ–2θ x-ray diffraction scan of a Ni-coated CuNiAl substrate.
Figure 17B:
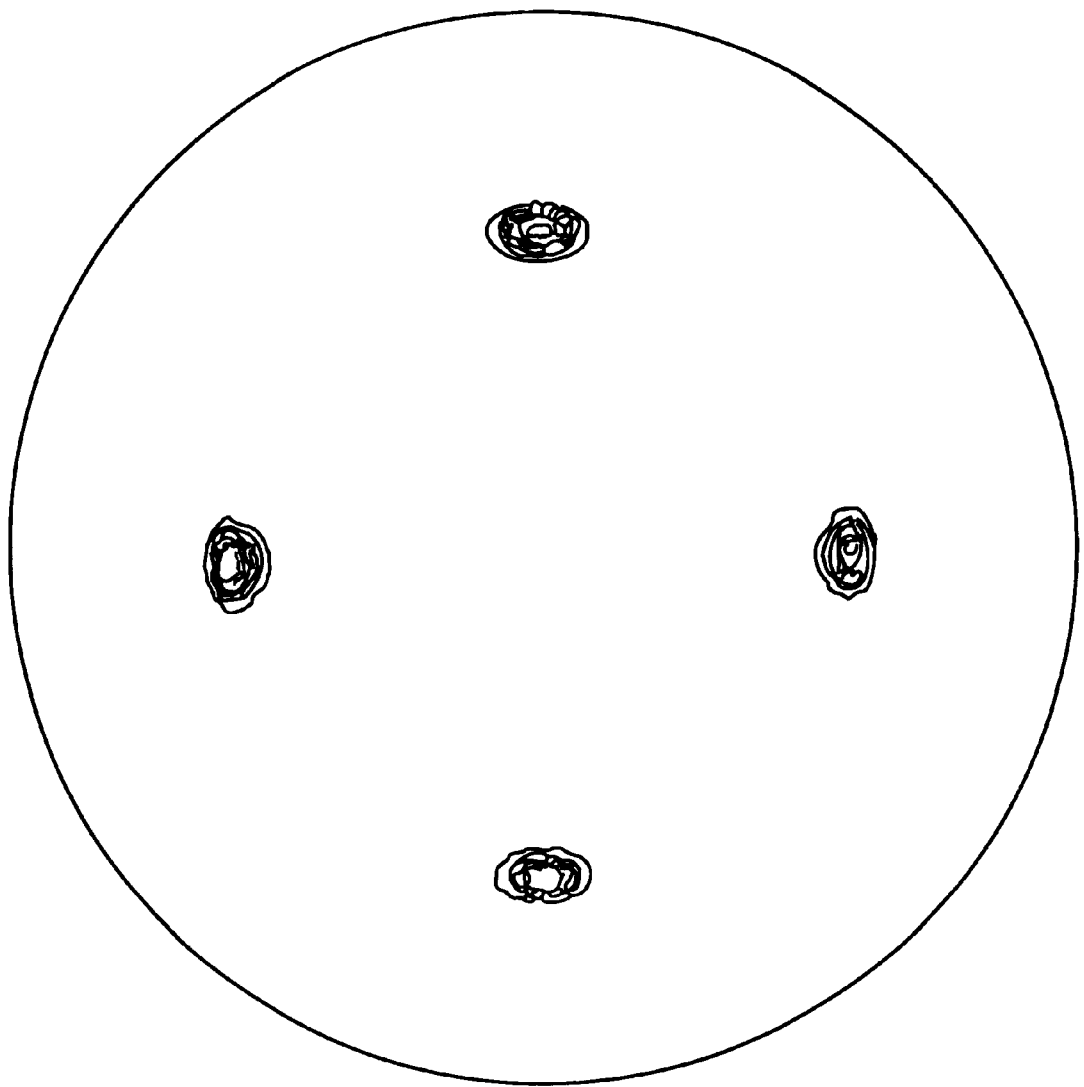
FIG. 17B is a pole figure showing the CeO$_2$ film.

A Ni-coated CuNiAl foil is formed, as in Example 7. The Ni-plated foil is transferred to a vacuum chamber and heated to 650° C. in forming gas (95% argon gas+5%hydrogen) for 45 minutes prior to sputter-deposition of about 25 nm CeO$_2$ at 650° C., at a rate of about 0.2 A/s, and a pressure of about 125 mTorr using a Ce target. FIGS. 17A and 17B respectively show a theta-two-theta X-ray diffraction and pole figure showing epitaxy of the CeO$_2$ film.

Example 9

This example describes sputter deposited intermediate layers. NiCu substrates were deformed and annealed, as described in Example 1 to produce textured substrates with FWHM of approximately 7 degrees. Textured Cu metal substrates were produced using identical processes. Intermediate layers were deposited using conventional magnetron sputtering at a deposition rate of 0.15–0.30 nm/sec. In all cases, the Ar sputter gas pressure was approximately 10 microns. Intermediate layers were deposited at several temperatures to evaluate for epitaxial growth without subsequent annealing. Deposition temperatures and the texture of the intermediate layer(s) are provided in the following table of results.

| Sample No. | Substrate Material | Intermediate Layer | Deposition Temp. (° C.) | Intermediate Layer Texture (FWHM) | Notes |
| --- | --- | --- | --- | --- | --- |
| 1 | Cu | Cr | 590 | Not textured | Cr immiscible in Cu |
| 2 | Cu | Cr | 450 | Not textured | Cr immiscible in Cu |
| 3 | Cu | Ni | 450 | 6.3 | |
| 4 | NiCu | Ni | 450 | 6.7 | |
| 5 | NiCu | Nb | 575 | N | Nb immiscible in Cu |
| 6 | NiCu | Nb | 450 | N | Nb immiscible in Cu |
| 7 | NiCu | Pd | 440 | 5.1 | |
| 8 | NiCu | Pd/Cr | 440/455 | 7.0/7.1 | Cr textured on Pd |
| 9 | NiCu | Pd/Cr/Pd | 430 | 7/9.2/7 | |
| 10 | NiCu | Pd/Cr/Pd | 380 | 6.9/8/6.9 | |
| 11 | NiCu | Pt | 480 | 7.7 | |
| 12 | NiCu | Pd/CeO2 | 475/750 | Not textured | Pd absorbed by substrate |
| 13 | NiCu | Ni | 400 | 5.7 | |
| 14 | NiCu | Al | 520 | Not observable | Very weak (200) |
| 15 | NiCu | Ni/YBCO | 465 | 6.1 | 4K transition in YBCO |

Figure 18:
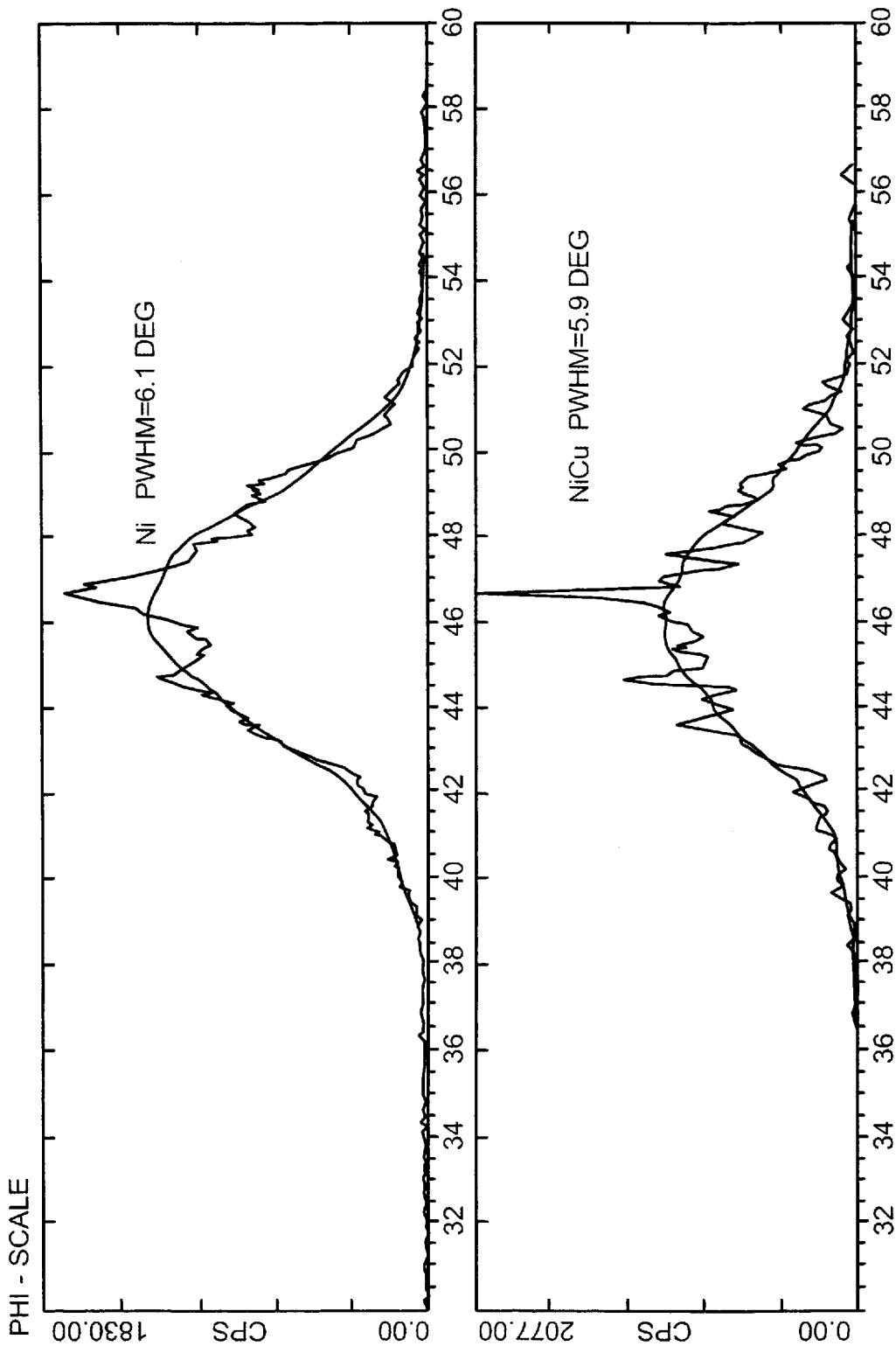
FIG. 18 is a phi-scan for a Ni-coated NiCu substrate.
Figure 19:
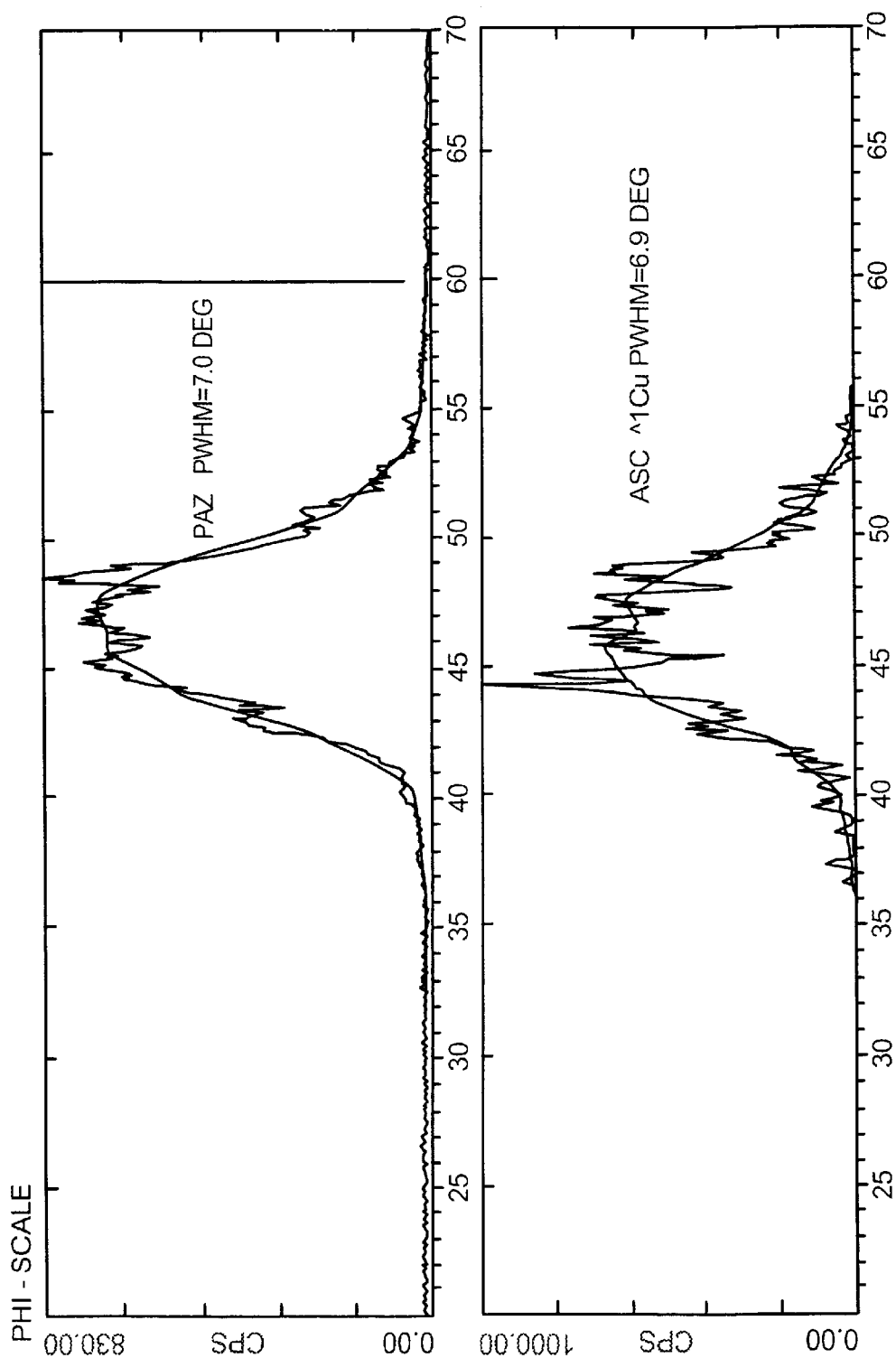
FIG. 19 is a phi-scan for a Pd-coated NiCu substrate.

A phi-scan showing texture for a Ni intermediate layer on NiCu (Sample 15) is shown in FIG. 18. A phi-scan showing texture for a Pd intermediate layer on NiCu (Sample 8) is shown in FIG. 19. These results show that in situ epitaxial growth is possible for fcc metals on the nonmagnetic substrate alloy at temperatures at least as low as 380° C. The results also indicate that, for the process parameters evaluated, bcc metals are difficult to grow epitaxially on Cu metal and the binary alloy. The use of a first intermediate film (for example, Pd) allowed the growth of textured Cr on the binary alloy.

It should be appreciated by those skilled in the art that the specific embodiments disclosed above may readily be utilized as a basis for modifying or designing other methods structures for carrying out the same purpose of the present invention. It should also be realized by those skilled in the art that such equivalent constructions do not depart from the spirit and scope of the invention as set forth in the appended claims.

What is claimed is:

1. An article comprising:
   a biaxially textured alloy substrate;
   an intermediate layer, wherein the intermediate layer, as deposited, inhibits the formation of surface oxides under predetermined conditions;
   and a superconducting layer disposed over the intermediate layer.

2. The article of claim 1, wherein the biaxially textured substrate has a cube textured surface.

3. The article of claim 1, wherein the biaxially textured substrate comprises nickel.

4. The article of claim 3, wherein the biaxially textured substrate comprises nickel as a major component.

5. The article of claim 3, wherein the biaxially textured substrate further comprises copper.

6. The article of claim 4, wherein the biaxially textured substrate further comprises chromium in atomic percent of from about 5 to about 20 percent.

7. The article of claim 1, wherein the biaxially textured substrate is formed by rolling deformation and annealing.

8. The article of claim 1, wherein the intermediate layer is at least about 0.2 micrometers thick.

9. The article of claim 8, wherein the intermediate layer is at least about 0.5 micrometers thick.

10. The article of claim 9, wherein the intermediate layer is at least about 1.0 micrometers thick.

11. The article of claim 1, wherein the intermediate layer is at least partially incorporated into the substrate alloy.

12. The article of claim 11, wherein the intermediate layer is wholly incorporated into the substrate alloy.

13. The article of claim 1, further comprising at least a first epitaxial film layered on the intermediate layer.

14. The article of claim 13, wherein the first epitaxial film is a buffer layer.

15. The article of claim 14, further comprising a plurality of buffer layers layered on the substrate alloy.

16. The article of claim 14, wherein the superconducting layer is layered on the buffer layer.

17. The article of claim 15, further comprising a superconducting layer layered on the plurality of buffer layers.

18. A superconducting article comprising:
   a biaxially textured alloy substrate;
   an intermediate layer, wherein the intermediate layer, as deposited, inhibits the formation of surface oxides under predetermined conditions;
   at least one buffer layer deposited on the intermediate layer;
   at least one superconducting layer on the at least one buffer layer; and
   a cap layer on the superconducting layer.

* * * * *